United States Patent [19]

Sato

[11] Patent Number: 5,608,492
[45] Date of Patent: Mar. 4, 1997

[54] SCANNING TYPE EXPOSURE APPARATUS AND METHOD AND DEVICE MANUFACTURING METHOD

[75] Inventor: Mitsuya Sato, Yokohama, Japan

[73] Assignee: Canon Kabushiki Kaisha, Tokyo, Japan

[21] Appl. No.: 378,740

[22] Filed: Jan. 26, 1995

[30] Foreign Application Priority Data

Jan. 26, 1994 [JP] Japan .................................. 6-024779
Jan. 18, 1995 [JP] Japan .................................. 7-024701

[51] Int. Cl.6 ........................................... H01L 21/30
[52] U.S. Cl. ............................................. 355/68; 355/69
[58] Field of Search ................................ 355/53, 67, 69, 355/77, 68

[56] References Cited

U.S. PATENT DOCUMENTS

| | | | |
|---|---|---|---|
| 4,711,568 | 12/1987 | Torigoe et al. | 355/68 |
| 4,822,975 | 4/1989 | Torigoe | 219/121.85 |
| 4,884,101 | 11/1989 | Tanimoto | 355/68 |
| 4,947,047 | 8/1990 | Muraki | 250/492.2 |
| 4,970,546 | 11/1990 | Suzuki et al. | 355/53 |
| 4,974,919 | 12/1990 | Muraki et al. | 350/6.6 |
| 5,053,614 | 10/1991 | Yui et al. | 250/205 |
| 5,097,291 | 3/1992 | Suzuki | 355/69 |
| 5,107,275 | 4/1992 | Tsuruoka et al. | 346/1.1 |
| 5,119,390 | 6/1992 | Ohmori | 372/25 |
| 5,171,965 | 12/1992 | Suzuki et al. | 219/121.6 |
| 5,191,374 | 3/1993 | Hazama et al. | 355/43 |
| 5,250,797 | 10/1993 | Sano et al. | 250/205 |
| 5,475,491 | 12/1995 | Shiozawa | 355/68 X |
| 5,483,311 | 1/1996 | Sakakibara et al. | 355/53 |
| 5,491,534 | 2/1996 | Shiozawa | 355/69 |

*Primary Examiner*—Arthur T. Grimley
*Assistant Examiner*—David A. Lane
*Attorney, Agent, or Firm*—Fitzpatrick, Cella, Harper & Scinto

[57] ABSTRACT

A scanning type exposure apparatus and method includes structure and steps for: scanningly moving a mask and a substrate relative to light pulses; continuously irradiating the light pulse to the substrate through the mask; and controlling an exposure amount of the substrate, wherein the control causes an average value of light quantity of a predetermined number of continuous light pulses to be substantially equal to a target value by controlling the light quantity of a next light pulse, in accordance with an integrated light quantity of a previous number of light pulses.

22 Claims, 15 Drawing Sheets

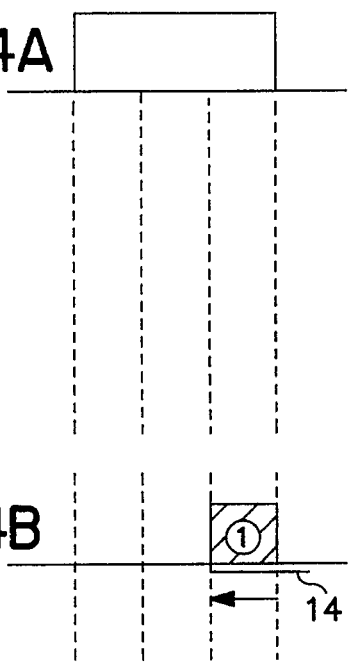
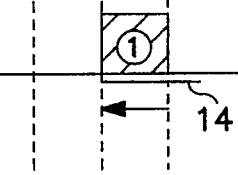
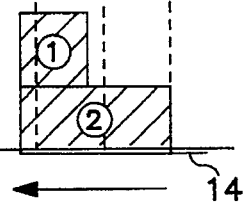
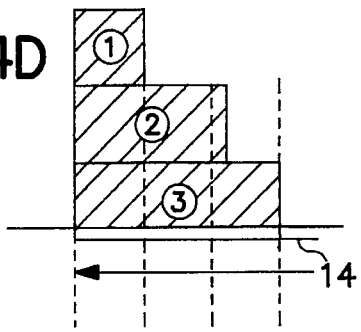
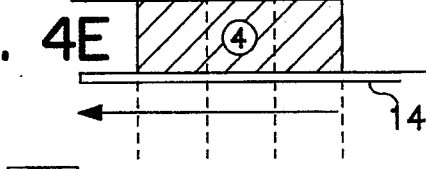
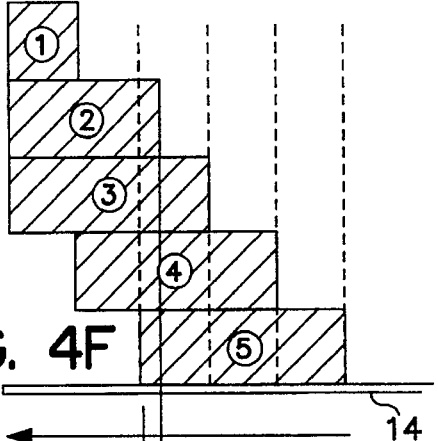

SCANNING TYPE EXPOSURE APPARATUS AND METHOD AND DEVICE MANUFACTURING METHOD

FIELD OF THE INVENTION AND RELATED ART

The present invention relates to a scanning type exposure apparatus, and a device manufacturing method for manufacturing IC'S, LSI circuits, CCD's, magnetic heads, liquid crystal panels, or the like.

The present invention is particularly suitable for manufacturing semiconductor devices having a high density of integration wherein illumination of a reticle and exposure of a wafer are properly controlled, and particularly in a scanning type exposure apparatus wherein a pattern of a reticle is transferred onto a wafer using a projection system for transferring a part of a pattern of a reticle onto a wafer, the illumination system having a pulsewise light source for providing a slit-like beam. Such a manufacturing method typically uses a scanning mechanism for scanning, at a predetermined speed ratio relative to the projection system and the slit light, the reticle and the wafer.

It is known that a pattern of the reticle is illuminated with slit-like light, and the pattern thus illuminated is transferred onto a wafer while the scanning operation is being effected (scanning type exposure apparatus or scanning type semiconductor exposure apparatus).

FIG. 1 shows a typical scanning type exposure apparatus.

As shown in this Figure, a part of a pattern 61 of a reticle 8 is illuminated with the light (pulse light) in the form of a slit, and an image of a part of the pattern 61 is projected onto the wafer 14 at a reduced magnification. At this time, the reticle 8 and the wafer 14 are moved in the opposite directions as indicated by arrows, relative to the projection system 13 and the slit light 60, at the speed ratio which is the same as the reduction magnification ratio of the projection system 13. Also, a number of pulse light illuminations are repeated to transfer the whole pattern of the reticle 8 onto the one chip area or multiple chip areas of the wafer 14.

In such an exposure apparatus, uniform integrated exposure amounts are preferable for the shot areas of the wafer (chip area). Here, the uniformity of the integrated exposure amount is influenced by the longitudinal component of the slit light 60 illumination and a scanning direction component of the same. The longitudinal uniformity is determined by the energy intensity distribution in this direction of the slit light, and the uniformity in the scanning direction is determined by the number of illumination pulses for the wafer, the variation of the light energy in individual pulse light from the pulse light source, and the energy intensity distribution of the pulse light in the scanning direction. In the conventional exposure apparatus, in order go increase the uniformity of the integrated exposure amount in the scanning direction, the light energy for the individual light pulses from the light source are stabilized to a certain degree, and the same number of pulses are applied to any given point in the shot area of the wafer during the scanning operation.

In other words, in the conventional system:

The integrated exposure amount control accuracy at any point in the shot area=$\sigma/\sqrt{N}$% ... (1)

where N is the number of pulses applied to a given point in the shot area, and $\sigma$ % is a variation ratio of the light energy from the pulse light source.

In order to increase the uniformity of the integrated exposure amount in the scanning direction, the number of pulses N is increased.

However, the increase of the pulse number N means a longer exposure period with the result of lower throughput of the exposure apparatus. Additionally, by reducing the light energy per one pulse, the power of the pulse light source which involves very high running cost is used with energy attenuation.

SUMMARY OF THE INVENTION

Accordingly, it is a principal object of the present invention to provide a scanning type exposure apparatus and method and a device manufacturing method using the same in which the exposure non-uniformity in the scanning direction is minimized.

According to an aspect of the present invention, there is provided a scanning type exposure apparatus comprising: scanning means for scanningly moving a mask and a substrate relative to pulse light; light illuminating means for continuously irradiating pulse light to the substrate through the mask; and control means for controlling an exposure amount of the substrate, wherein the control means controls an average value of light quantity of a predetermined number of continuous pulse light to be substantially equal to a target value by controlling the light quantity of a next light pulse in accordance with an integrated light quantity of a previous number of light pulses.

According to another aspect of the present invention, there is provided a scanning type exposure method comprising the steps of: scanningly moving a mask and a substrate relative to pulse light; and controlling an exposure amount of the substrate, wherein the control step controls an average value of light quantity of a predetermined number of continuous light pulses to be substantially equal to a target value by controlling the light quantity of a next pulse light in accordance with an integrated light quantity of previous number of light pulses.

According to a further aspect of the present invention, the pulse light from the irradiating means has a substantially rectangular light intensity distribution in a direction of a scanning movement.

According to a further aspect of the present invention, the pulse light from the irradiating means has a substantially trapezoidal light intensity distribution in a direction of the scanning movement.

According to a further aspect of the present invention, the trapezoidal shape is symmetrical with respect to a straight line.

According to a further aspect of the present invention, the irradiating means includes an excimer laser for emitting the pulse light.

According to a further aspect of the present invention, the predetermined number is equal to the number of light pulses projected to each portion of the substrate while each portion of the substrate passes through an illumination area of the light pulses.

According to a further aspect of the present invention, the pulse light from the irradiating means has a substantially trapezoidal light intensity distribution in a direction of the scanning movement, and the predetermined number is equal to the number of light pulses projected to each portion of the substrate while each portion of the substrate passes through the longer side of the trapezoidal shape of an illumination area of the light pulses.

According to a further aspect of the present invention, the control means resets a relationship between an instruction level and a light quantity on the basis of each light quantity for a plurality of light pulses and the instruction level used for supplying the plurality of light pulses.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 4(A) through 4(F) illustrate integrated exposure when a rectangular beam profile is used.

DESCRIPTION OF THE PREFERRED EMBODIMENTS

Figure 2:
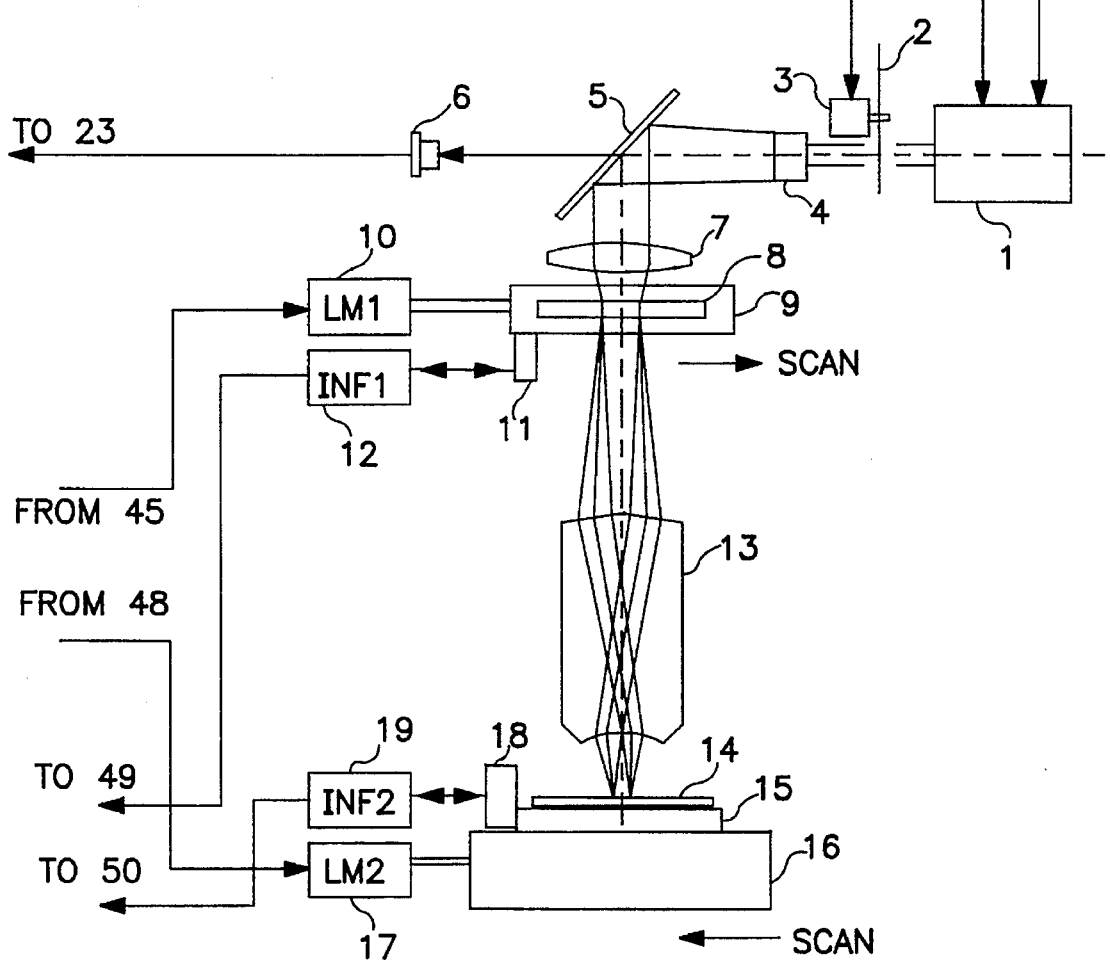
FIG. 2 illustrates a major part of an apparatus according to a first embodiment of the present invention.
Figure 3:
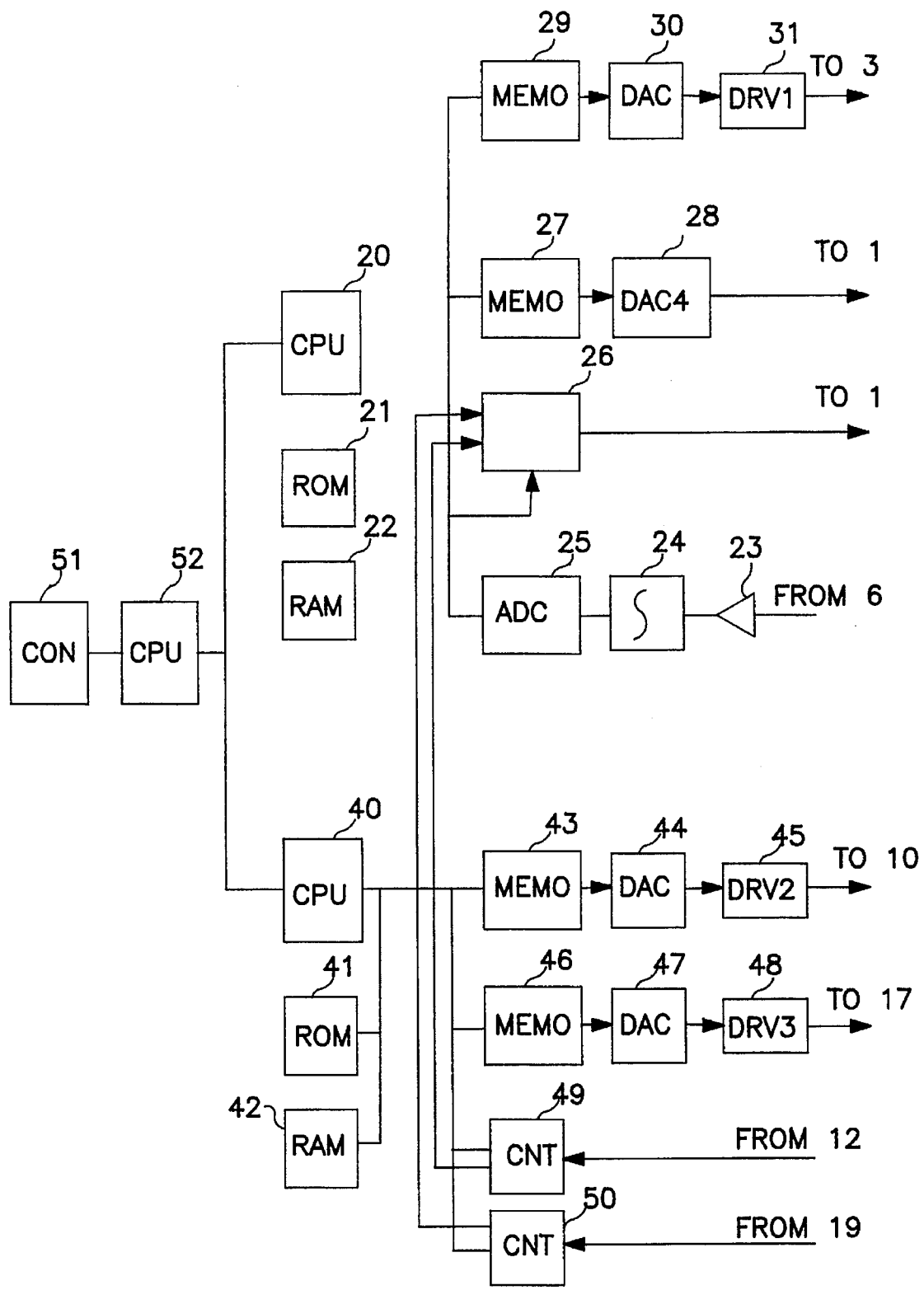
FIG. 3 illustrates a major part of an apparatus according to the first embodiment.

FIGS. 2 and 3 illustrate major parts of a scanning type exposure apparatus for manufacturing devices according to a first embodiment of the present invention. In FIG. 2, reference numerals 1–19 designate components of the apparatus.

Reference numeral 1 designates an excimer laser (pulse light source) for emitting pulse light. An attenuator 2 attenuates the light energy of the pulse light from the excimer laser 1 down to a predetermined level. The attenuator 2 is driven by a motor 3. An optical element 4 reforms a cross-section of the pulse light from the excimer laser 1 into a predetermined size rectangular shape and reforms the light energy intensity distribution in the scanning direction into a symmetrical trapezoidal beam profile. A flat mirror bends the optical path by 90 degrees. A photosensor 6 measures the light energy of the light from the excimer laser 1. Designated by reference numeral 7 is a condenser lens; 8 is a reticle having a device pattern; 9 is a reticle stage for holding the reticle 8. A linear motor 10 scanningly drives the reticle stage 9 in the direction of an arrow. A bar mirror 11 is fixed to the reticle stage 9. A laser interferometer 12 detects the speed of the reticle stage 9. A projection system 13 transfers a part of the pattern of the reticle 8 onto a wafer 14, which is held by a wafer chuck 15 which is in turn supported on a wafer chuck 15. A linear motor 17 functions to drive the wafer stage 16 in the direction indicated by an arrow. A bar mirror 18 is fixed on the wafer stage 16. A laser interferometer 19 functions to detect the speed of the wafer stage 16.

In FIG. 3, reference numerals 20–31 designate elements in an illumination controller.

A CPU 20 controls the illumination system particularly as to an integrated exposure amount. A ROM 21 stores a program code to be executed by the CPU 20. A RAM 22 functions to write and read data by the CPU 20. A current and voltage converter 23 functions to convert, to a voltage signal, a light current signal from the photosensor 6 for detecting the illuminance on the reticle surface. An integrator 24 integrates the voltage output signal of the current and voltage converter 23. An AD converter 25 functions to convert the analog output of the integrator 24 to a digital level. An operator 26 always fetches positional information of the reticle and wafer and produces light emitting instructions to the excimer laser 1 when the positional information reaches preset levels. The set positions can be selected by CPU 20. Memory 27 functions to store charge voltage instruction levels for the excimer laser 1. A DA Converter 28 converts, to analog data, the charge voltage instruction level to the excimer laser 1 which is digital data from the memory 27. Memory 29 stores attenuation rate data for the attenuator 2 from the CPU 20. A DA converter 30 converts, to analog data, the attenuation rate for the attenuator 2 which is digital data from the memory 29. A driver 31 drives a driving motor 3 for positioning the attenuator corresponding to the attenuation ratio supplied from the DA converter 30.

In FIG. 3, reference numerals 40–50 designate elements constituting a stage controller.

A CPU for the stage 40 functions to control The speed and position controls for the reticle stage and the wafer stage. A ROM stores program code to be executed by the CPU 40. A RAM 42 is used to write and read by the CPU 40. Memory 43 functions to hold a scanning speed instruction level for the reticle stage 9 from the CPU 40. A DA converter 44 converts, to analog data, the digital data from the memory 43. A driver 45 amplifies the analog data from the converter 44 to drive the linear motor 10. Memory 46 stores the scanning speed instruction level for the wafer stage 16. A DA converter 47 functions to convert, into analog data, the digital data from the memory 46. A driver 48 amplifies the analog data from the DA converter 47 to drive the linear motor 17. A reticle stage counter 49 functions to integrate (count) pulse trains proportional to the scanning speed from the laser interferometer 12 for the reticle stage 9 to provide positional information. A wafer stage position counter 50 functions to integrate (count) the pulse trains proportional to the scanning speed from the laser interferometer 19 for the wafer stage 16 to provide the positional information thereof.

In FIG. 3, reference numerals 51 and 52 designate elements for a total controller.

An operator console 51 functions to permit various parameter inputs and various operations for the semiconductor manufacturing device. A main CPU 52 carries out overall control of the illumination system CPU 20 and the stage CPU 40 on the basis of the information from the operator console 51.

According to this embodiment, the uniformity of the integrated exposure amount in the scanning direction (with the minimum number of illumination pulses), and simultaneously, the light energy instruction level for producing the light energy can be corrected real time.

The apparatus will be described in more detail. This embodiment is intended to accomplish the following:

X1 improvement of the uniformity of the integrated exposure amount in the scanning direction.

X2 real time correction of the light energy instruction level.

The respective items will be described. The following is the content of the description.

X1-1 uniformity of integrated exposure amount

X1-2 integrated exposure amount control

X1-2-1 average value control

X1-2-2 divided control within slit

X1-3 integrated exposure amount control according to this embodiment

X1-3-1 continuous movement average value control

X1-3-2 continuous effective pulse movement average value control

X1-3-3 accuracy of the integrated exposure amount in the continuous effective pulse movement average value control X1-3-4 problem with continuous effective pulse movement average value X1-3-5 continuous partial pulse movement average value control X1-3-6 accuracy of the integrated exposure amount in continuous partial pulse movement average value control X1-4 prevention for oscillation in control system X1-4-1 oscillation phenomenon X1-4-2 counter measures for the oscillation X1-4-3 accuracy of integrated exposure amount with the oscillation prevention X1-5 symmetrical trapezoidal beam profile X2-1 correction of interrelating equation between charge voltage and light energy X1-1 uniformity of integrated exposure amount In this embodiment, this uniformity is accomplished by the following in a scanning type semiconductor manufacturing exposure apparatus.

A1 improvement of the uniformity of the integrated exposure amount

A2 minimizing difference between the integrated exposure amount of a target integrated exposure amount A description will be given as to the uniformity of the integrated exposure amount. For the purpose of simplicity of the explanation, the light energy output is without variation.

FIG. 4A illustrates a rectangular beam profile, and FIG. 4B–4F illustrate the proceeding of the integrated exposure for the shot area 14. As will be understood from these Figures, in order to improve the integrated exposure amount uniformity for the shot area (the area to be exposed), the number of light beam projections to any point in the shot area is made constant. In order to accomplish this, the continuity between the adjacent rectangular beam profile in the shot area is strictly controlled. If this is not enough, the integrated exposure amount uniformity is deteriorates at the portion as indicated by P1 in FIG. 4F (the exposure is over the optimum level by one pulse).

However, this embodiment uses a symmetrical trapezoidal beam profile instead of the rectangular beam profile to ease the difficulty for strict control in the continuity between adjacent profiles.

Figure 5A:
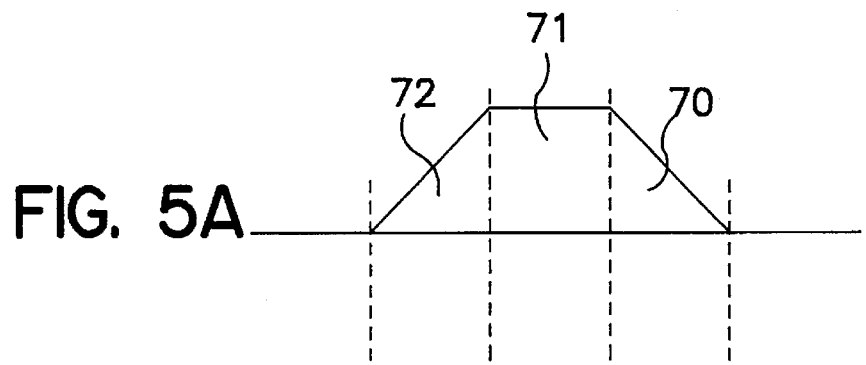
FIGS. 5(A) through 5(D) illustrate an integrated exposure using symmetrical trapezoidal beam profile.
Figure 5B:
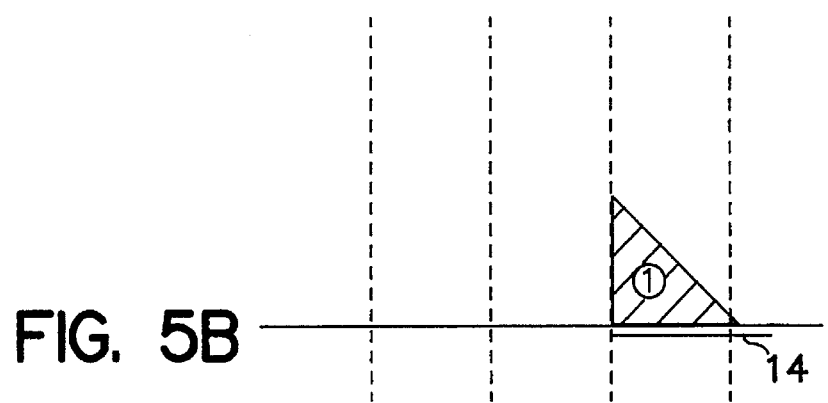
Figure 5C:
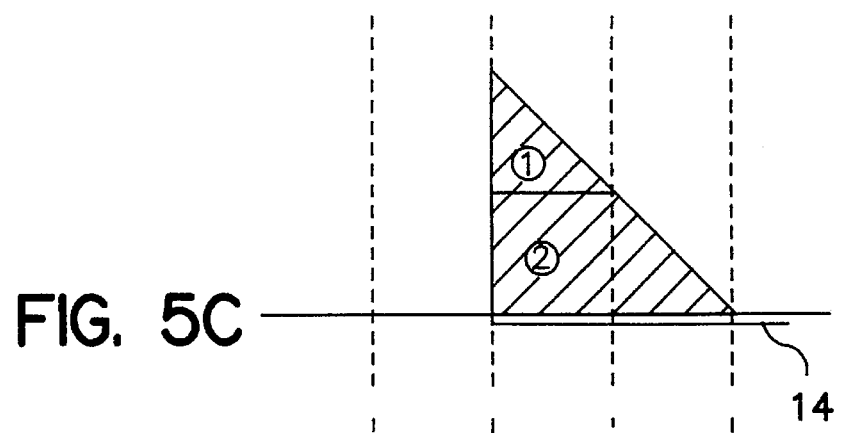
Figure 5D:
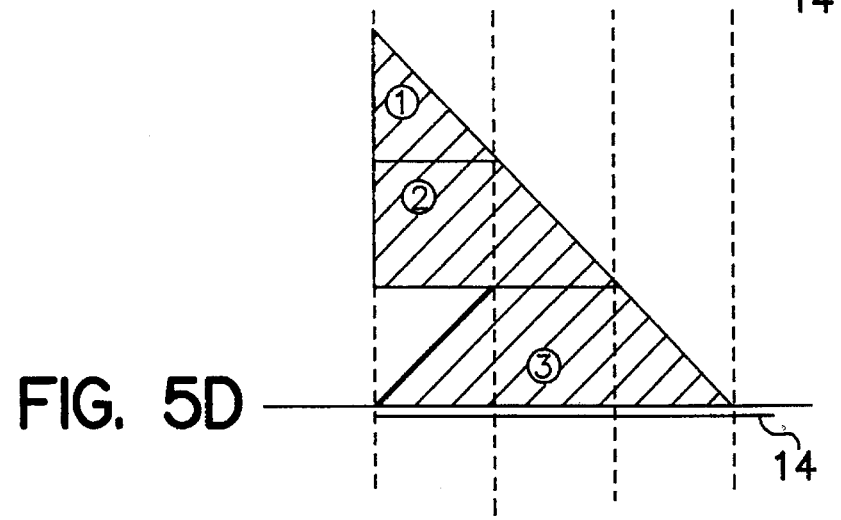
Figure 6A:
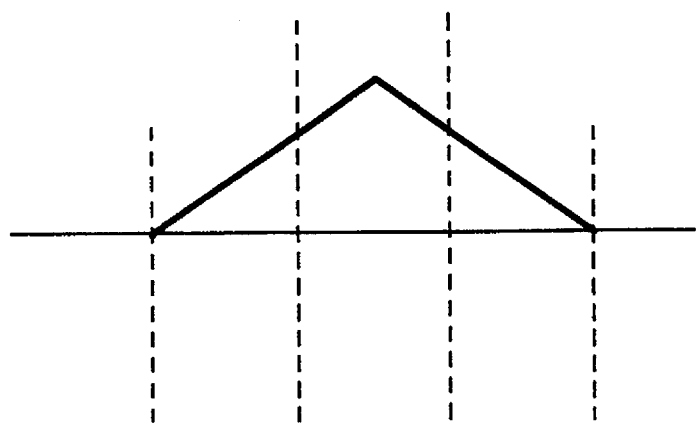
FIGS. 6(A) through 6(C) show various examples of beam profiles.
Figure 6B:
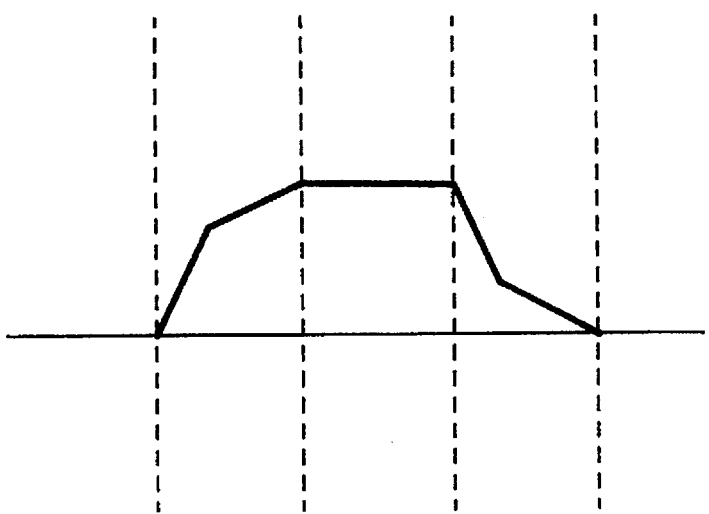
Figure 6C:
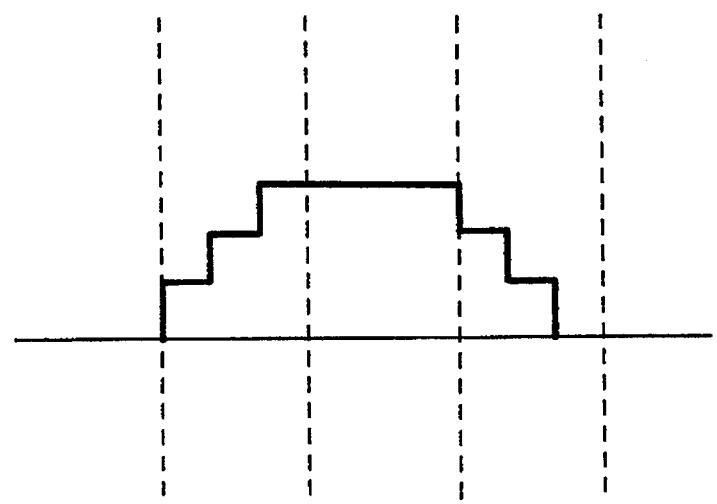

FIGS. 5B–5D show the process of the integrated exposure. As will be understood from these Figures, in order to increase the uniformity of the integrated exposure amount for the shot area 14, a light energy attenuated area 72 is applied to a particular area which has been illuminated with the light energy increased area 70, by which the integrated exposure amount of the particular area is also made uniform. The symmetrical trapezoidal beam profile is effective to achieve this. In addition to this beam profile, there are profiles capable of satisfying this, as shown in FIGS. 6A–6C.

In other words, in order to improve the integrated exposure amount uniformity, the following are desirable.

B1 In the case of the rectangular beam profile, the number of beam applications is made constant for any point.

B2 In the case that the rectangular beam profile is not used, the non-uniformity of the integrated exposure amount resulting at the light energy increased area, is removed by canceling it with the light energy attenuated area to accomplish the uniformity.

(X1-2) Integrated exposure amount control

A description will be given as to the integrated exposure amount control according to this embodiment when the light energy from the pulse light source is with variations. For the integrated exposure amount control, there are the following two methods X1-2-1 end X1-2-2. For the purpose of simplicity of the explanation, the beam profile is assumed to be rectangular.

(X1-2-1) Average value control

Figure 7:
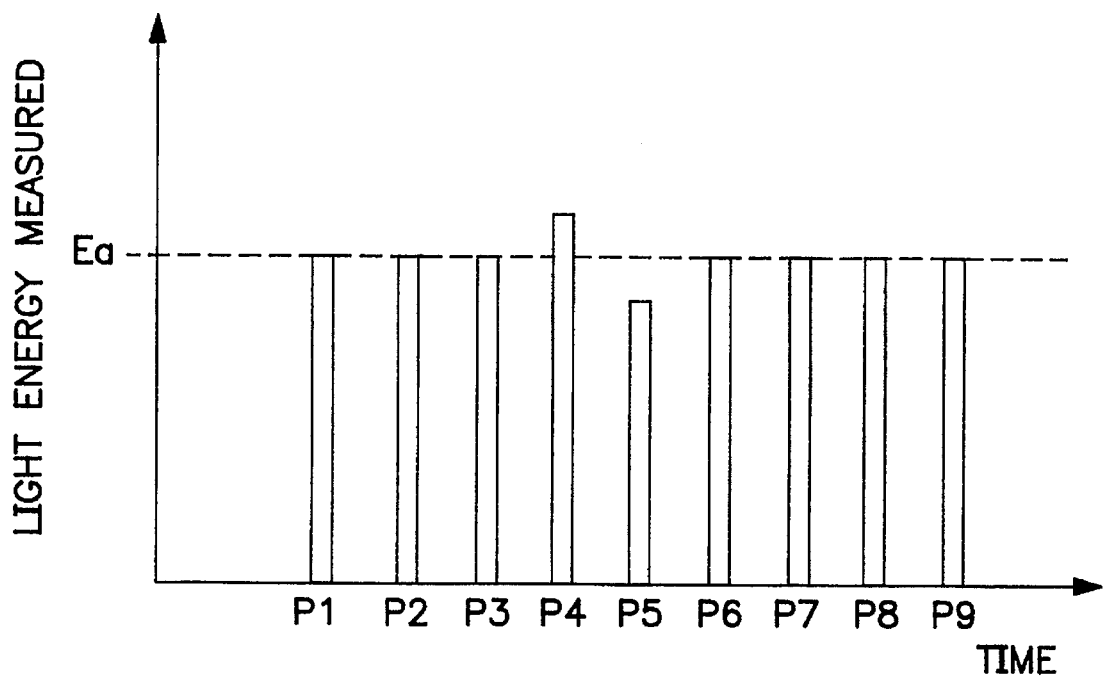
FIG. 7 illustrates a control of an average.

By the sensor 6, the light energy is measured for each pulse to determine the actual pulse energy. If it is deviated by a predetermined amount from a target average pulse energy, a laser charge control for the next pulse light is controlled to correct (increase or decrease) the light by the predetermined amount for the average pulse energy, thus accomplishing the target average energy. FIG. 7 shows this.

With this system, when the light energy variation ratio of the pulse light source is $\sigma$, and the target average pulse energy is Ea, the integrated exposure amount error until the N1 pulse is $\sigma \times Ea$, and the integrated exposure amount error until N2 pulses is also $\sigma \times Ea$. When the N pulse is a difference between the N2 pulse and the N1 pulse, the integrated exposure amount error at the N pulse is an average of squares of the integrated exposure amount error, namely:

$$\text{Integrated exposure amount error at a given point} = \sqrt{(\sigma \times Ea)^2 + (\sigma \times Ea)^2} = \sqrt{2} \times (\sigma \times Ea) \quad (2)$$

$$\text{Integrated exposure amount accuracy at a given point} = \quad (3)$$

(integrated exposure amount error at a given point)/

(total integrated exposure amount at a given point) =

$$\sqrt{2} \times (\sigma \times Ea)/(N \times Ea) = \sqrt{2} \times \sigma/N$$

(X1-2-2) Divided control within slit

During exposure, exposure amounts at a plurality of points along the scanning direction in the pulse light illumination area are traced and measured by a linear array sensor in synchronism with the scanning operation, and a calculation is made for each pulse as to the integrated exposure amounts for the plurality of points from the measurements obtained by the sensors. Then, the differences between the calculated values and the corresponding ideal integrated exposure amounts (halfway) for the plurality of points is determined. Subsequently, the illumination distribution in the slit illumination 60 is controlled so that the ideal exposure amounts are provided for the plurality of points.

Figure 8:
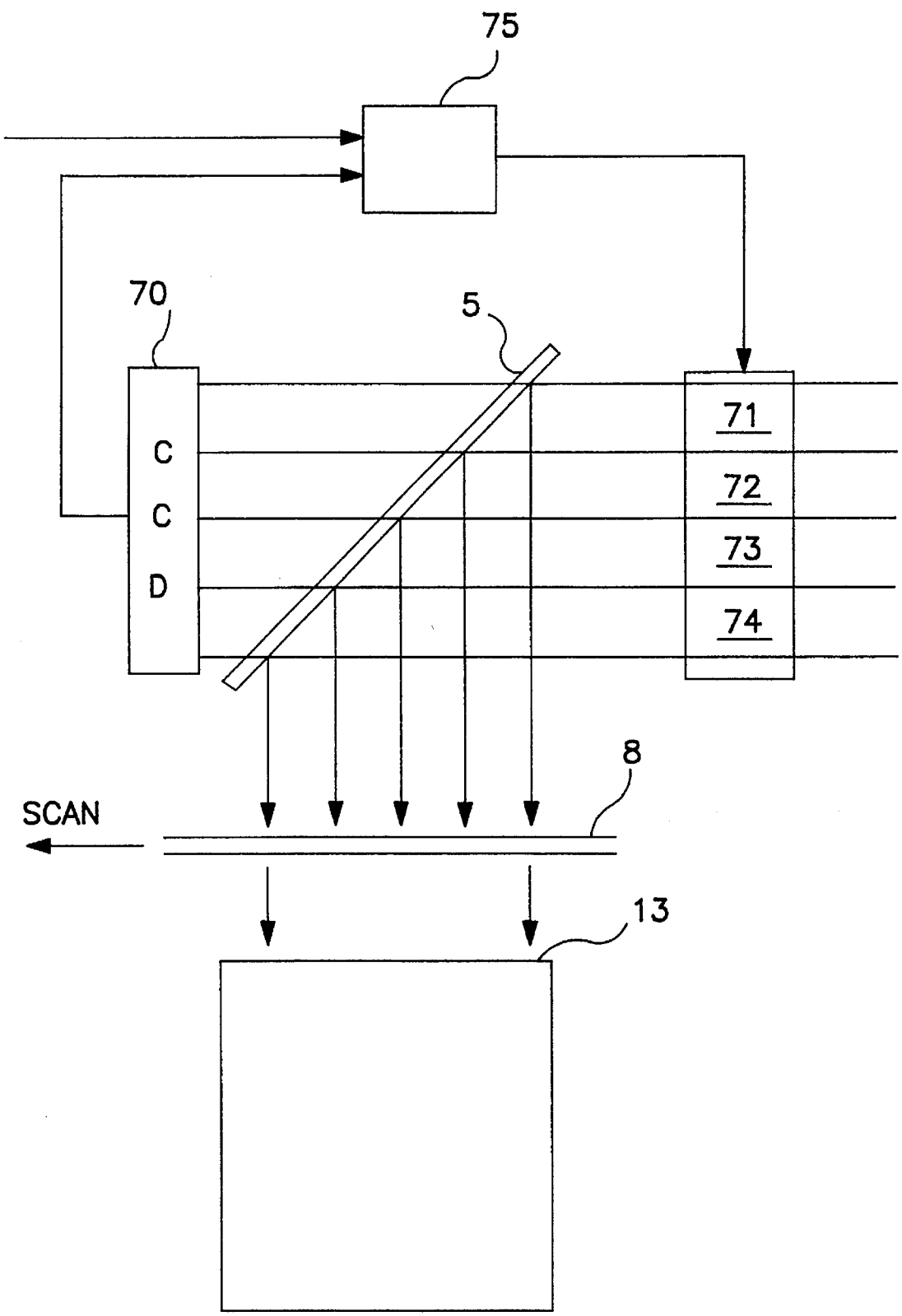
FIG. 8 illustrates divided control.

FIG. 8 illustrates this system. In this Figure, a CCD rear array sensor 70 detects accurately the illuminance of a plurality of points in the scanning direction in the exposure area at real time. In-slit illumination distribution adjusting mechanism 71–74 is capable of following the light-emitting of the pulse light source at the frequency of 100 Hz. In the Figure, the area in the slit is divided into four parts in the scanning direction, and each divided areas are detected. The illuminances are changeable for each divided area by partial light control mechanism 71–74 through a device 75.

The adjusting mechanism 71–74 comprises an ND filter exchanging mechanism or interference filter rotating mechanism or variable aperture slit or The like.

The device 75 calculates the integrated exposure amount for each point, and makes the necessary calculation for driving the in-slit illuminance distribution adjusting mechanism. It determines the current point position in the slit on the basis of the positional information of the scanning stage 16, and converts it to the position on the CCD linear array sensor 70. Designated by reference numerals 5, 8 and 13, are a mirror, a reticle and a projection system.

(X1-3) Integrated exposure amount control system (X1-3-1) Continuous movement average value control In this embodiment, the following is satisfied.

C1 An average of measured energy of all of a continuous predetermined number of pulses is controlled to be a predetermined average level corresponding to the target integrated exposure amount, for each light emission of the pulse light during the exposure.

C2 The number of continuous predetermined pulses is controlled to be the number of pulses applied when a given point in the exposure area 14 passes (by the scanning operation) the illumination area 60 in the form of a slit.

C3 When the beam profile of the pulse light in the scanning direction (intensity distribution of the cross-section) is not a rectangular beam profile, the number of continuous predetermined pulses is controlled to be the number of pulses applied when a given point in the exposure area 14 passes through the increased energy area and decreased energy area of the beam profile.

The system C2 is applicable to any beam profile in the scanning direction of the pulse beam. The system C3 is suitably applicable to a beam profile other than the rectangular beam profile, that is, a symmetrical rectangular beam profile, for example, in the scanning direction of the pulse light.

In the following descriptions, the C2 system is called "continuous effective pulse movement average value control", and the system C3 is called "continuous partial pulse movement average value control", for simplicity.

(X1-3-2) Continuous effective pulse movement average value control

Figure 9:
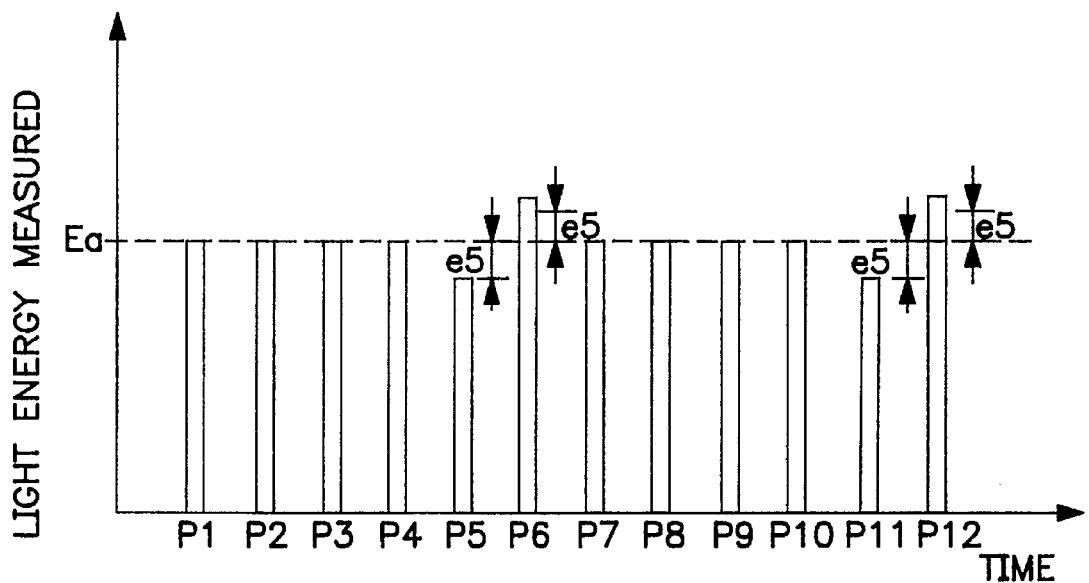
FIG. 9 illustrates a control for a continuous effective pulse movement average value.

FIG. 9 shows an example of measurements of light pulse energy in the continuous effective pulse movement average value control. In this Figure, the number of predetermined continuous pulses is 6.

In FIG. 9:

D1 The pulse light was actually emitted, and the light energy of the pulses P2–P4 was measured. As a result, they are the same as the target average energy Ea (instruction level) for all pulses.

D2 However, when the pulse light is actually emitted for the P5 pulse with the light energy instruction level being the target average energy Ea, and the light energy is measured, the result is that the measured energy level was lower than the target average energy Ea by an energy error e5.

D3 Then, in order to achieve the target average energy Ea for the average energy of 6 pulses P1–P6, the light energy instruction level for P6 pulse is changed by adding the energy error e5 to the target average energy Ea, and the pulse light is emitted.

D4 For pulses P7–P10, the actual pulse light emission is carried out with the light energy instruction level being the target average energy Ea. As a result of measurement of the light energy, it was equal to the target average energy Ea.

D5 For pulse P11, in order for the average energy of the continuous 6 pulses to be equal to the predetermined level (Ea) corresponding to the target integrated exposure amount, the light energy which is the same as with pulse P5 is to be applied. Therefore, the instruction level of the light energy is changed by reducing the target average energy Ea by the energy error e5.

D6 For pulse P12, for the same reason as with above paragraph D5, the light energy instruction level is changed by adding the energy error e5 to the average target energy Ea. Then, the pulse light is emitted.

Figure 10:
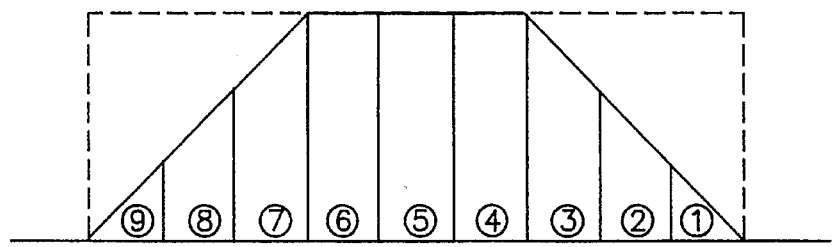
FIG. 10 illustrates an integrated exposure amount accuracy of the continuous effective pulse movement average value control.

As will be understood from the description in conjunction with FIG. 10, the exposure amount control system of this embodiment, the average energy for a continuous predetermined number of pulses, uniform (the same level). With the integrated exposure amount control system of this embodiment, the instruction levels and measurements of the light energy exhibit periodical nature with a predetermined number of continuous pulses.

(X1-3-3) Accuracy of integrated exposure amount in the continuous effective pulse movement average value control When the continuous effective pulse movement average value control is used with the rectangular beam profile, all of the integrated exposure amounts at any point in the exposure area 14 are within the variation of one pulse energy.

In other words, the accuracy of the integrated exposure amount control at any point in the exposure area 14 is $\sigma/N$ %, where N is the number of pulses applied to a given point in the exposure area 14, and $\sigma$ (%) is a ratio of the variation of the light energy from the pulse light source.

It will be understood that the accuracy is clearly better than $\sigma/\sqrt{N}$ in a conventional system and than $\sqrt{2}\sigma/N$ in the average control.

A description will be given as to the integrated exposure amount accuracy when the continuous effective pulse movement average value control is applied to a symmetrical trapezoidal beam profile. FIG. 10 Illustrates the symmetrical beam profile in this embodiment, more particularly, this embodiment uses the profile indicated by solid lines in FIG. 10.

The integrated exposure amount error is indicated by a broken line in FIG. 10. It is smaller than the integrated exposure amount error in the case of the rectangular beam profile, and it is:

The integrated exposure amount error $Ga \leq Ea \times \sigma$.

When the number of pulses applied when passing through the increased energy area and the decreased energy area is M1, and When the number of pulses applied when passing through the light energy flat area is M2, the integrated exposure amount accuracy=(integrated exposure amount error)/(total integrated exposure amount)≤(Ea×σ)/(Ea× M1+Ea×M2)≤σ/(M1+M2) ... (5)

If it is assumed that the width of the increased area is equal to the width of the flat area and also to the width of the decreased area, the following results:

½×N

That is, the intergrated exposure amount accuracy≤(½)× σ/N ... (6)

(X1-3-4) Problem with continuous effective pulse movement average value control

Figure 11:
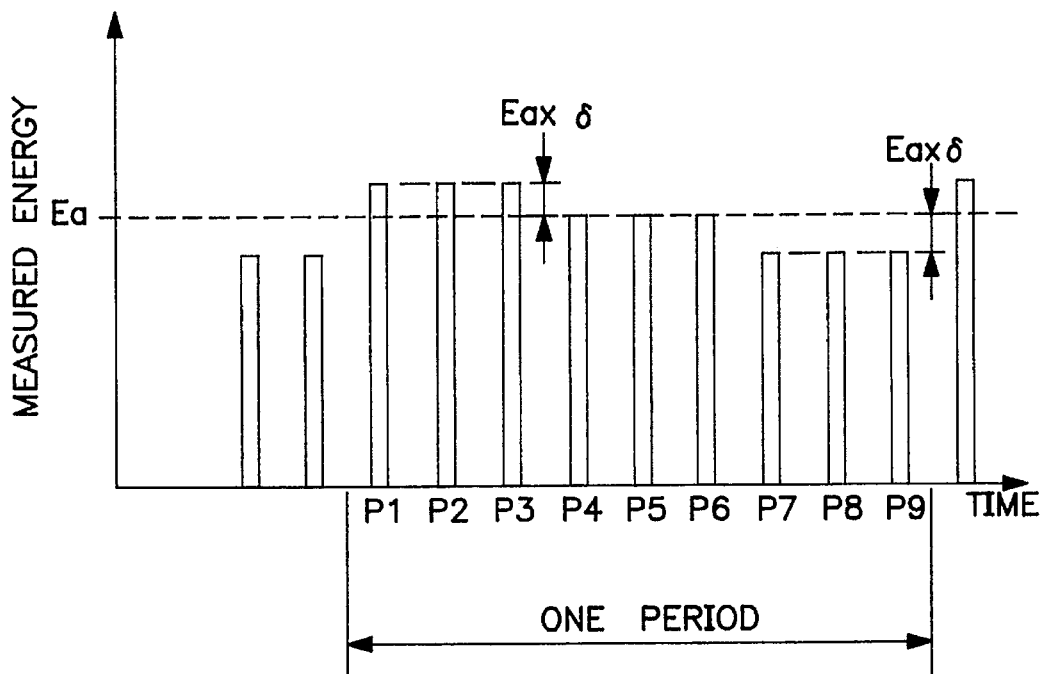
FIG. 11 illustrates a problem with the continuous effective pulse movement average value control.

The instruction level and the measured level of the light pulse energy may be waved with the maximum period which is the predetermined continuous number of pulses, statistically, as shown in FIG. 11. If it is assumed that the light beam has the symmetrical trapezoidal beam profile, there may be one possible problem. An example will be described.

When an exposure area is exposed by 9 pulses using the symmetrical trapezoidal beam profile shown in FIG. 10, the integrated exposure amount is a sum of the light energy indicated by (1)–(9) in FIG. 10. The energy (1)–(9) is a part of the light energy of the pulses P1–P9 in FIG. 11. Under the situation shown in FIG. 11, a relatively large light energy as with pulses P1–P3 is applied for the increased area, and a relatively small light energy as in pulses P7–P9, is applied to the light increased area.

In this case, even if the integrated exposure amount is constant, it becomes difficult to provide a constant sum of the light energy from the light energy increased area 70 and the decreased area 72 shown in FIG. 5 with the result of deteriorated uniformity of the integrated exposure amounts.

Under the situation shown in FIG. 11, the following is used:

the integrated exposure amount from the increased $$\text{area } Er = 1/6 \times Ea \times (1 + \sigma) + 3/6 + \qquad (7)$$
$$Ea \times (1 + \sigma) + 5/6 \times Ea \times (1 + \sigma),$$

and the integrated exposure amount from the decreased (8)

$$\text{area } Ef = 1/6 \times Ea \times (1 - \sigma) + 3/6 \times$$
$$Ea \times (1 - \sigma) + 5/6 \times Ea \times (1 - \sigma).$$

By doing so, the integrated exposure amount uniformity (9)

$$\text{error } Ee = Er - Ef = 9/6 \times Ea \times (1 + \sigma) -$$
$$9/6 \times Ea \times (1 - \sigma) = 18/6 \times Ea \times \sigma$$

(X1-3-5) Continuous partial pulse movement average value control

When the symmetrical trapezoidal beam profile is used, the number of predetermined continuous pulses described above is made equal to the number of pulses applied when a given point in the exposure area passes through the energy increased area 70 or the energy decreased area 72 in the slit-like illumination area, so that the light energy received by a given point in the exposure area of the wafer 14 from the energy increased area 70 or the energy decreased area 72 is made constant.

According to this system, the deterioration of the integrated exposure amount uniformity depending on the beam profile in the continuous effective pulse movement average value control is decreased.

Figure 12:
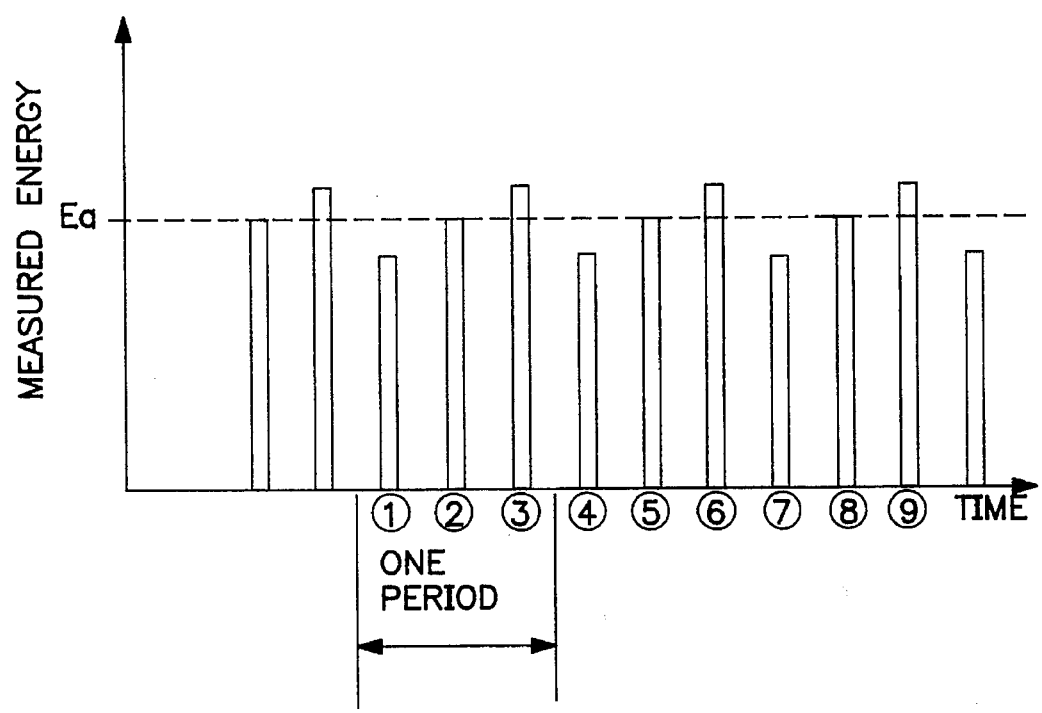
FIG. 12 illustrates a problem with the continuous effective pulse movement average value control.

In this system, the above-described phenomenon (FIG. 11) does not occur. However, even with this system, the periodic light energy error shown in FIG. 12 may statistically occur although the probability is very low.

The following is an example.

the integrated exposure amount from the increased (10)

$$\text{area } Er = 1/6 \times Ea \times (1 - \sigma) + 3/6 \times Ea +$$
$$5/6 \times Ea \times (1 + \sigma),$$

and the integrated exposure amount from the decreased (11)

$$\text{area } Ef = 1/6 \times Ea \times (1 + \sigma) + 3/6 \times Ea +$$
$$5/6 \times Ea \times (1 - \sigma)$$

That is, the integrated exposure amount uniformity error (12)

$$Ee = Er - Ef = 4/6 \times Ea \times (1 + \sigma) -$$
$$4/6 \times Ea \times (1 - \sigma) = 8.6 \times Ea \times \sigma$$

From the foregoing, it will be understood that If the variation of the light energy is assumed as being constant σ, the continuous partial pulse movement average control is better than the continuous effective pulse movement average control from the standpoint of avoiding the deterioration of the fixed uniformity depending on the beam profile.

(X1-3-6) The accuracy of the integrated exposure amount in a continuous partial pulse movement average value control In the continuous partial pulse movement average control, the integrated exposure amount control area is divided more than in the continuous effective pulse movement average value control, and therefore, the integrated exposure amount control accuracy is more or less worse than the continuous effective pulse movement average value control.

In other words, when the symmetrical trapezoidal beam profile shown by the solid line in FIG. 10 is used, the integrated exposure amount error from the increased light area
$Gr \leq Ea \times \sigma$ ... (13)

the integrated exposure amount error from the flat light area
$Gc = Ea \times \sigma$ ... (14)

the integrated exposure amount error from the decreased light area
$Gf \leq Ea \times \sigma$ ... (15)

Therefore, the integrated exposure amount (16)

$$\text{error} \leq \sqrt{(Ea \times \sigma)^2 + (Ea \times \sigma)^2 + (Ea \times \sigma)^2} \leq$$
$$\sqrt{3} \times (Ea \times \sigma)$$

the integrated exposure amount accuracy = (17)

(total integrated exposure amount error)/

(total integrated exposure amount) $\leq \sqrt{3} \times$ $(Ea \times \sigma)/(Ea \times M2 + Ea \times M2) \leq \sqrt{3} \times \sigma/(M1 + M2)$ If it is assumed that the width of the increased light area is equal to the width of the light flat area and to the width of the light decreased area, $$M1=M2=(1/3)\times N$$

That is, $$\text{The integrated exposure amount accuracy} = \sqrt{3} \times (3/2 \times \sigma/N) \quad (18)$$

Thus, it is considered that the continuous partial pulse movement average value controlled is more effective than the continuous effective pulse movement average value control when the widths of the light-increased area and the light-decreased area are relatively large as compared with the light flat area.

Figure 13:
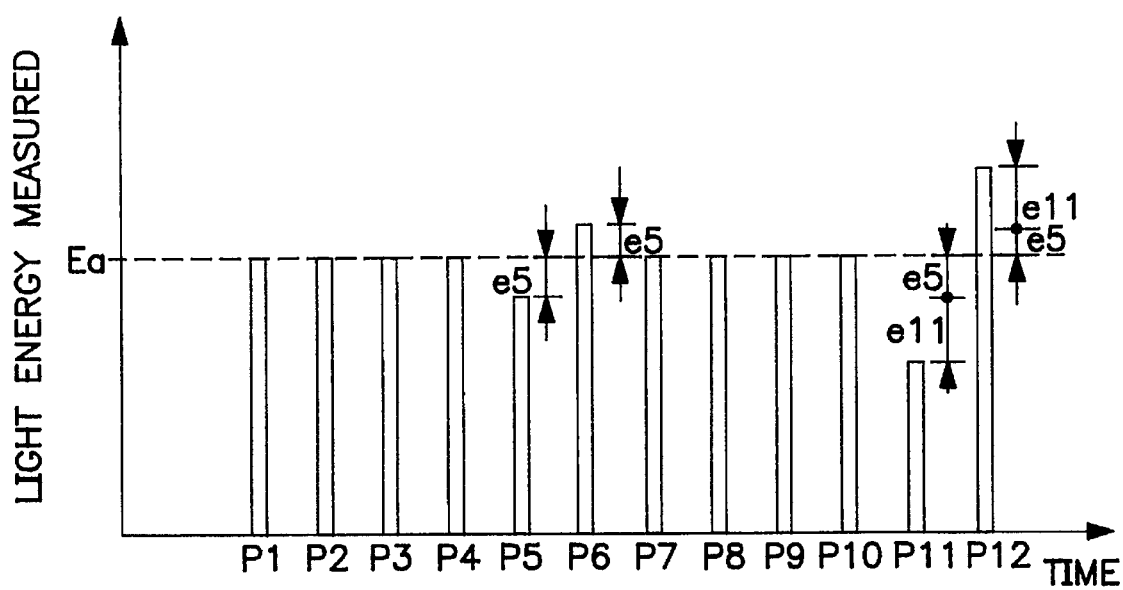
FIG. 13 illustrates oscillation.

(X1-4) Oscillation prevention of the control system
(X1-4-1) Oscillation phenomenon FIG. 9 shows an example of the change of the measurements of the light pulse energy when the integrated exposure amount control system according to the embodiment of the present invention is used. However, the axial relationship between the instruction level and the measurement of the light energy, is more complicated. The reason is in the variation of the output of the light energy. FIG. 13 shows an output variation of the light energy.

E1 For the pulses P1–P4 and the pulses before them, the instruction level of the light energy is the target average energy Ea, and the actual pulse light emission is carried out. Then, the light energy measurements are the same as the target average energy Ea.

E2 However, for pulse P5, the instruction level is equal to the target average energy Ea, and the actual pulse emission is carried out. The measurement of the light energy showed that the measured energy was smaller than the target average energy Ea by the energy error e5, due to the light energy variation.

E3 In order to make the integrated exposure amount by 6 pulses (pulses P1–P6) equal to the target integrated exposure amount for 6 pulses, the instruction level of the light energy for pulse P6 is made equal to the target average energy Ea plus the energy error e5. Then, the pulse light emission is carried out.

E4 For pulses P1–P10, the instruction level of the light energy is restored to the target average energy Ea, and the actual pulse emission is carried out. Thereafter, the light energy is measured, and it has been confirmed that it is the same as the target average energy Ea.

E5 For pulse P11, in order to make the integrated exposure amount by continuous 6 pulses equal to the target integrated exposure amount of 6 pulses, the same light energy as pulse P5 is to be produced. Therefore, the instruction level of the light energy is provided by reducing energy error e5 from the target average energy Ea. Thereafter, the pulse light is emitted. However, the results of measurement is that it is smaller by energy error e11 than the target average energy Ea reduced by the energy error e5.

E6 For pulse P12, in order to make the integrated exposure amount by the continuous 6 pulses equal to the target integrated exposure amount of 6 pulses, the instruction level of the light pulse energy by pulse P6 is determined to be the target average energy Ea plus the energy error e5 plus the energy error e11. Then, the pulse light is emitted.

As will be understood from the foregoing, according to the integrated exposure amount control of this embodiment, there is a periodic nature in the instruction level of the light energy and the measurements. When the variation of the light energy output is overlaid thereon, the instruction level of the light pulse energy is much larger or smaller than the average target energy, statistically.

The instruction level of the light energy, generally, is limited in the instruction input range. If the instruction level exceeds the range, the correct control is not carried out. Such a state is called "diversion of the instruction level", here.

(X1-4-2) Counter measurements against the oscillation

In the integrated exposure amount control in this embodiment, in order to avoid The diversion of the instruction level, the instruction level of the light pulse energy is always recalculated to be close to the target average energy at a predetermined ratio, and the recalculated value is used as the instruction level of the light pulse energy.

By doing so, as shown in FIG. 13, even if an extremely large or small instruction level of the light pulse energy occurs, the light pulse energy instruction level converges gradually to the average target energy, while the above-described period is repeated for several times. Here, the predetermined ratio is called "instruction level attenuation ratio", and is expressed by $\zeta$.

If the instruction level attenuation ratio $\zeta$ is larger than 1, the diversion of the instruction level occurs. With the decrease of the ratio in the range less than 1, the diversion of the instruction level can be prevented, but the error for the correction increases. The executing instruction level recalculated for each pulse is always close to the target average energy, but the error from the total sum of the energy by a predetermined number of continuous pulses is not integrated for each pulse. The reason is as follows. The error resulting from the above-described recalculation is at most the error resulting from recalculation for one pulse in the total sum of the energy measurement for a predetermined number of pulses, because the control is effected such that the total sum of the energy measurement for a predetermined number of pulses is constant.

In this embodiment, the instruction level attenuation ratio $\zeta$ is 0.8, and therefore the integrated exposure amount control error resulting from the oscillation prevention is at most:

$$(1.0-\zeta)\times\sigma\times Ea = 0.2\times\sigma\times Ea$$

In the embodiment, the excimer laser is used as the pulse light source. Recently, an excimer laser having a light energy variation $\sigma$ of 1.7% approximately, is available. In this case, the error due to the recalculation for one pulse is $0.2\times1.7 = 0.37\%$.

When the predetermined pulse number is 20, this value corresponds to the $0.0185\% = 0.37\%/20$, as the integrated exposure amount control error, which is sufficiently small as compared with the current target integrated exposure amount control accuracy of 0.5–1.0%.

(X1-4-3) The integrated exposure amount accuracy in the oscillation prevention

In the case of the rectangular beam profile, the accuracy of the integrated exposure amount control according to the embodiment is a root mean square of the above-described $\sigma/N$ and the control error due to the oscillation prevention, as follows:

$$\text{the integrated exposure amount control accuracy} = \sqrt{1+(1.0-\zeta)^2} \times \sigma/N \quad (19)$$

Here, the instruction level attenuation ratio $\zeta$ is assumed to be 0.8, then $$\text{the integrated exposure amount control accuracy} = 1.02\times\sigma/N \quad (20)$$

In other words, the integrated exposure amount control method according to this embodiment is clearly better in the integrated exposure amount control accuracy than the conventional system ($\sigma/\sqrt{N}$) and the average control ($\sqrt{2}\sigma/N$), even if the oscillation prevention system is used.

(X1-5) Symmetrical trapezoidal beam profile

In the foregoing it has been stated that when the beam profile in the pulse light scanning direction is a symmetrical trapezoidal profile, and the widths of the light increasing area and the light decreasing area are relatively large as compared with the light flat area, the continuous partial pulse movement average value control is effective to improve the uniformity of the integrated exposure amount.

The integrated exposure amount uniformity by the light energy applied when the energy increased area and the energy decreased area are passed, is improved by the continuous partial pulse movement average value control, but there is room for further improvement in the Control accuracy of the integrated exposure amount. This is because the integrated exposure amount control is not carried out for the energy flat area. In order to effect the integrated exposure amount control for the energy flat area, the following two requirements are simultaneously satisfied.

F1 In the number M1 of the pulses applied when the energy increased area and the energy decreased area pass, the average of the energy measurement is always constant corresponding to the target integrated exposure amount.

F2 In the number M2 of the pulses applied when the energy flat area passes, the average of the energy measurements is controlled to be constant corresponding to the target integrated exposure amount.

Because of the continuity of the exposure in the scanning type, it is generally difficult to simultaneously satisfy the requirements F1 and F2 when the number of pulses, the number M1 and the number M2 are arbitrarily selected.

In order to simultaneously satisfy requirements F1 and F2, the pulse number, the number M1 and the number M2 are in integer multiple relationships. In order to satisfy this, the lengths of the energy increased area and the energy decreased area of the symmetrical trapezoidal profile, and the length of the energy flat area, are in the integrated multiple relation.

(X2) Real time correction of the light energy instruction level

Here, in order to permit the real time correction for the relation between the light energy instruction level and the applied light energy, a plurality of light energy instruction levels described above, are used.

Figure 14A:
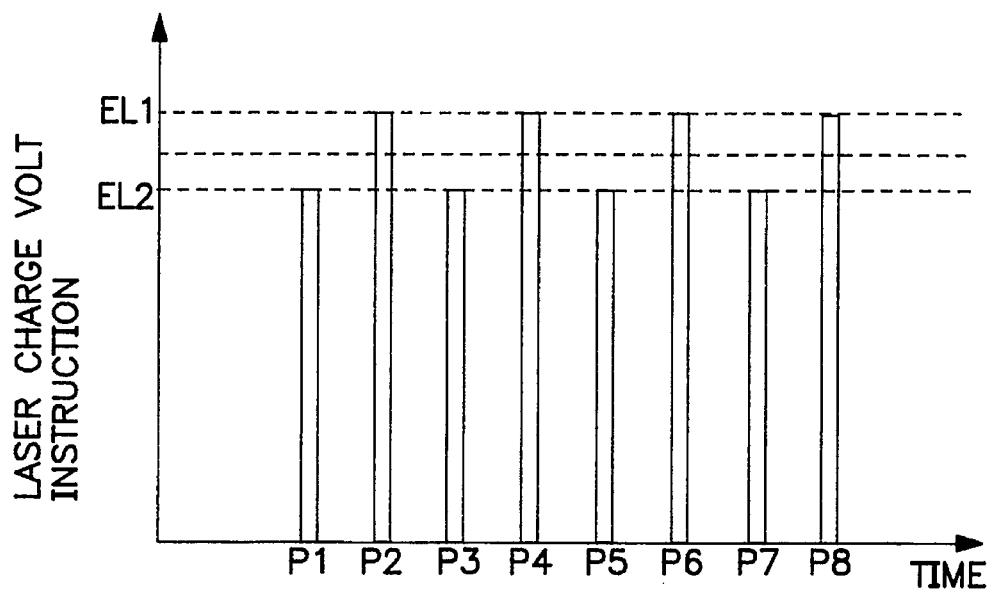
FIGS. 14(A) and 14(B) illustrate real time correction of the instruction level of the light energy.

(X2-1) Correction for the relation between the charge voltage and the light energy FIG. 14A shows the change of the laser charging voltage instruction level when the present invention is used. In this Figure, two target average energy levels are used. During the actual exposure operation, the laser charging voltage instruction levels with predetermined differences are produced.

Figure 14B:
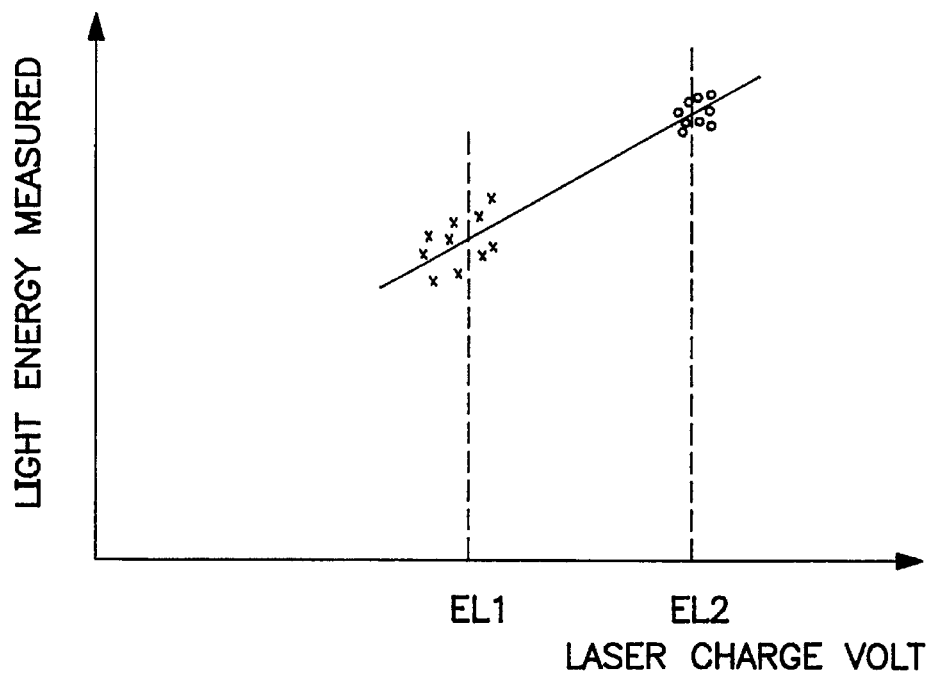

As shown in FIG. 14A, during the actual exposure operation, a laser charge voltage of a predetermined difference is produced, and the light energy of the pulse light at this time is measured, so that the relationship between the laser charge voltage and the light energy of the pulse light is measured at real time as in FIG. 14B. Here, P1–P2 designate each pulse light.

This is applicable to the above-described continuous effective pulse movement average value control or the continuous partial pulse movement average value control. When the two target average energy levels are used, the effective pulse number, or the partial pulse number are selected to be an even number, and an average of the light energy of the continuous two pulses is always equal to the target average energy described above.

Referring to FIGS. 2 and 3, the operation of the semiconductor device manufacturing exposure apparatus will be described in the following order.

Y1 Various parameters
Y1-1 Increase area, decreased area of the light beam profile and overlaying requirement
Y1-2 Integrated exposure amount requirement
Y1-3 Integrated exposure amount accuracy requirement
Y1-4 Average target energy setting range
Y1-5 Scanning speed controllable range
Y1-6 Excimer laser oscillation frequency setting range
Y2 Determination of various parameters
Y2-1 Pulse number Nc until the decreased area is overlaid on the increased area
Y2-2 Scanning speed Vw
Y2-3 Excimer laser upper energy instruction level E11 and excimer laser lower energy instruction level E12
Y2-4 Excimer laser oscillation frequency fe
Y2-5 Transmittance $\alpha$ of attenuator
Y3 Initial setting of illumination system
Y3-1 Pulse number Nc until decrease area is overlaid on increased area
Y3-2 Scanning speed Vw
Y3-3 Excimer laser upper energy instruction level E11 and excimer laser lower energy instruction level E12
Y3-4 Excimer laser oscillation frequency fe
Y3-5 Transmittance a of attenuator
Y4 Introduction of wafer
Y5 Alignment
Y6 Exposure
Y7 Delivery of wafer In this embodiment, the process is performed with the symmetrical trapezoidal beam profile, the above-described continuous effective pulse movement average value control, and the real time correction of the light energy instruction level.

(Y1) Various parameters

In the semiconductor manufacturing exposure apparatus, the following parameters relating to the exposure are inputted on an operator console 51.

(a1) Target integrated exposure amount Et
(a2) Target integrated exposure amount accuracy $\sigma t$ In the apparatus, the following parameters are first determined on the basis of the input parameters.

(b1) The number of pulses Nc until the decreased area is overlaid on the increased area
(b2) Scanning speed Vw
(b3) Excimer laser upper energy instruction level EL1 and excimer laser lower energy instruction level EL2
(b4) Excimer laser oscillation frequency fe
(b5) Transmittance a of attenuator The following is related to the determination of the above parameters.

Y1-1 The requirements for the increased area and decreased area of the light beam profile
Y1-2 Integrated exposure amount requirement
Y1-3 Integrated exposure amount accuracy requirement
Y1-4 Average target energy setting range
Y1-5 Controllable range of the scanning speed
Y1-6 Excimer laser oscillation frequency setting range The respective items will be described with the following definitions.

Width of energy increased area and energy decreased are=L1
Width of energy flat area=L2

The number of pulses applied when the energy increased area and energy decreased area are passed=M1

The number of pulses applied when the light energy flat area is passed=M2

The number of pulses until the decreased area is overlaid on the increased area=Nc=M1+M2

Minimum speed of the scanning stage=Vwmin

Maximum speed of the scanning stage=Vwmax

Minimum in the energy controllable range of the excimer laser=ELmin

Maximum in the energy controllable range of the excimer laser=ELmax

Center of the energy controllable range of the excimer laser=ELave=(½)×(Elmin+Elmax)

Minimum oscillation frequency of the excimer laser=femin

Maximum oscillation frequency of the excimer laser=femax

Average energy instruction level of the excimer laser=EL

Average target energy=Ea=EL×α

(Y1-1) The requirements for the increased area and the decreased area of the light beam profile As described in the foregoing, the overlaying between the increased area and the decreased area of the light energy and the integrated exposure amount non-uniformity is to be minimized. For this purpose, $$\text{the time period until the increased area and the decreased area are overlapped } t=(L1+L2)/Vw \ldots \quad (21),$$

and $$\text{the number of pulses until the decreased area is overlapped on the increased area } Nc=fe\times t=Fe\times(L1+L2)/Vw \ldots \quad (22)$$

(Y1-2) Integrated exposure amount requirement

The integrated exposure is effected by the symmetrical trapezoidal beam profile with the following ratio:

$$\text{the integrated exposure amount by the increased area } Er=\tfrac{1}{2}\times(L1/(L1+L2))\times Et \ldots \quad (23)$$

$$\text{the integrated exposure amount by the flat area } Ec=(L2/(L1+L2))\times Et \ldots \quad (24)$$

$$\text{the integrated exposure amount by the decreased area } Ef=\tfrac{1}{2}\times(L1/(L1+L2))\times Et \ldots \quad (25)$$

The integrated exposure amount Ec by the flat area is required within the time period in which the exposure area of the wafer is in the energy flat area width L2. Therefore, $$EC=(L2/(L1+L2))\times Et=(L2/Vw)\times fe\times Ea \ldots \quad (26)$$

Namely, $$Vw=(L1+L2)\times fe\times(Ea/Et) \ldots \quad (27)$$

By substituting equation (22), for equation (27), $$Nc=Et/Ea \ldots \quad (28)$$

(Y1-3) Integrated exposure amount accuracy requirement

From equation (5), $$\text{(target integrated exposure amount accuracy) } \sigma t = \quad (29)$$

$$\text{(integrated exposure amount error)/(total integrated exposure amount)} \leq \sigma/(M1+M2) \leq \sigma/Nc$$

Thus, in order to accomplish the target integrated exposure amount accuracy σt, $$Nc \geq \sigma/\sigma t \ldots \quad (30)$$

(Y1-4) Average target energy setting range

Average target energy Ea is as follows:

$$Ea=EL\times\alpha \ldots \quad (31)$$

In this embodiment, the average energy instruction level EL of the excimer laser is required to have the following controllable range.

(a) Energy control range for the continuous movement average value control=5×ELave×α

(b) Energy control range for dispersion control of the laser charging voltage instruction level=3×ELave×σ

For this purpose, the average energy instruction level EL for the excimer laser is in the following range.

$$ELmin + (8 \times ELave \times \sigma) \leq EL \leq ELmax - (8 \times ELave \times \sigma) \quad (32)$$

In this embodiment, the attenuator has 0–100% controllable range, and therefore, from equation (31), $$0 \leq Ea \leq ELmax-(8\times ELave\times\sigma) \ldots \quad (33)$$

(Y1-5) Scanning speed controllable range

The scanning speed generally has a controllable range. That is, $$Vmin \leq Vw \leq Vwmax \ldots \quad (34)$$

(Y1-6) Excimer laser oscillation frequency setting range

The excimer laser used in this embodiment has a minimum oscillation frequency of 0 Hz and a maximum oscillation frequency of 600 Hz. Generally, $$femin \leq fe \leq femax \ldots \quad (35)$$

For the purpose of improving the throughput, the following is used, $$fe=femax \ldots \quad (36)$$

(Y2) Determination of various parameters

In the semiconductor device manufacturing exposure apparatus of this embodiment, the parameters are determined in the following manner before the actual operation is started. The determination of the parameter is made by the main CPU 52 (FIG. 3) in this embodiment.

(Y2-1) Determination of the pulse number Nc emitted until the decreased area is overlaid on the increased area From equations (22), (34) and (36), $$femax \times (L1 + L2)/Vwmax \leq Nc \leq femax \times (L1 + L2)/Vwmin \quad (37)$$

From equations (28) and (33), $$Nc \geq Et/(ELmax=(8-Elave \times \sigma)) \ldots \quad (38)$$

From the integrated exposure amount accuracy requirement, $$Nc \geq \sigma/\sigma t \ldots \quad (30)$$

Thus, the minimum integer is satisfying equations (37), (38) and (30) as Nc. Here, in this embodiment, for the purpose of real time correction of the light energy instruction level, the dispersion control of the laser charging voltage instruction level is carried out, and therefore, the Nc value is the minimum even integer number satisfying equations (37), (38) and (30).

(Y2-2) Scanning speed Vw

On the basis of the determination of Nc, the scanning speed Vw is determined as follows from equations (22) and (36), $$Vw=femax \times (L1+L2)/Nc \ldots \quad (39)$$

(Y2-3) Excimer laser energy EL

On the basis of determination of Nc, the excimer laser energy EL is determined from equations (28) and (31) as follows:

$$EL=Et/(Nc \times \alpha) \ldots \quad (40)$$

Here, in order to effectively use the energy of the excimer laser, the transmittance a of the attenuator is 1. Then, $$EL=Et/Nc \ldots \quad (41)$$

The average energy instruction level of the excimer laser EL is required to satisfy the following from equation (32):

$$ELmin+(8 \times ELave \times \sigma) \leq EL \ldots \quad (42)$$

If the above equation (42) is not satisfied, the level of the excimer laser average energy instruction level EL is set to the lower limit of the controllable range as follows:

$$EL=ELmin+(8 \times ELave \times \alpha) \ldots \quad (43)$$

In this case, the transmittance $\alpha$ of the attenuator is set to be lower than 1.

In this embodiment, the dispersion control of the laser charging voltage instruction level is carried out for the purpose of real time correction of the relationship between the laser charging voltage and the light energy, and therefore, the excimer laser energy EL has the following two levels.

$$EL1=EL-(3 \times ELave \times \sigma) \ldots \quad (44)$$

$$EL2=EL+(3 \times ELave \times \sigma) \ldots \quad (45)$$

(Y2-4) Excimer laser oscillation frequency fe

In this embodiment, as described hereinbefore, the following is used for the purpose of increasing the throughput of the semiconductor device manufacturing exposure apparatus.

$$fc=femax \ldots \quad (36)$$

(Y2-5) Transmittance a of the attenuator

When equation (42) is satisfied, the transmittance a of the attenuator 1, but when it is not satisfied, the transmittance $\alpha$ of the attenuator is selected as follows:

$$\alpha=Et/(ELmin+(8 \times ELave \times \sigma)) \ldots \quad (46)$$

(Y3) Initial setting of the illumination system

Before the actuation operation is started, the various parameters are determined, and using the thus determined parameters, the initial setting of the illumination system is effected.

(Y3-1) The number of pulses Nc until the decreased area is overlaid on the increased area This parameter is a parameter for calculating the other parameters, and therefore, is not used for the initial setting.

(Y3-2) Scanning speed Vw

This parameter is supplied through a communication path to the stage CPU 40 by the main CPU 52 at the time of the initial setting. This parameter is used as a target scanning speed during the actual exposure operation.

(Y3-3) Excimer laser upper energy instruction level EL1 and lower energy instruction level EL2

These parameters are supplied to the illumination system CPU 20 through the communication path by the main CPU 52 at the time of initial setting. When the illumination system CPU 20 receives the parameters, it determines on the basis of the data in the ROM 21 the charge voltage for the excimer laser necessary for outputting the upper energy instruction level EL1 and the lower energy instruction level EL2, and they are stored in the RAM 22 as the charging voltage instruction levels.

(Y3-4) Excimer laser oscillation frequency fe

This parameter is supplied to the illumination CPU 20 and the stage CPU 40 through the communication path by the main CPU 52 at the time of the initial setting. When the illumination system CPU 20 receives this parameter, the excimer laser oscillation frequency fe is supplied to the excimer laser 1 through the communication path. This excimer laser oscillation frequency fe is not the one at which the excimer laser is oscillated unconditionally, but when the scanning speed Vw reaches the target scanning speed, the excimer laser 1 is instructed for the oscillation at this oscillation frequency. As to the output timing of the oscillation instruction to the excimer laser 1, a description will be given in paragraph Y6 "exposure".

(Y3-5) Attenuation ratio $\alpha$ of the attenuator

This parameter is supplied through the communication path to the illumination system CPU 20 by the main CPU 52 at the initial setting. The actual setting of the attenuator is effected as follows. The illumination system CPU 20 reads out the attenuator position information required for accomplishing the transmittance $\alpha$ from ROM 21, and the value is inputted into the memory 29. The digital data supplied to the memory 20 is converted to analog data by DA converter 30 and is supplied to the driver 31 for driving the attenuator, and the attenuator is driven.

(Y4) Introduction of wafer

Upon completion of the initial setting of the apparatus, the wafer stage 16 is moved to an wafer receiving position, and the wafer 14 is transferred onto the wafer chuck 15 of the wafer stage 16 from the wafer transportation system (not shown).

(Y5) Alignment measurement

Subsequently, using the alignment mark detector (not shown), the relative position between the alignment mark of the reticle 8 and the alignment mark on the chips of the wafer 14. By doing so, the relative positional relation between the reticle stage 9 and the wafer stage 14 to be taken at the scan exposure for the chips on the wafer 14, is determined.

(Y6) Exposure

Upon the completion of the alignment measurement, the relative positional relationship between the reticle stage 9 and the wafer stage 16 during the exposure operation is determined, and therefore, the absolute position of the wafer stage 16 at which the exposure is to be started is known. Since the scanning speed Vw and the excimer laser oscillation frequency fe for the exposure operation have already been calculated, the excimer laser 1 is permitted to oscillate from the exposure start absolute position for each chip for every predetermined movement width of the wafer stage, determined as follows:

Predetermined wafer stage movement $$\text{width } Lw = Vw/fe \ldots \quad (47)$$

This calculation is carried out by the stage CPU 40, the data of the wafer stage movement width described above and the exposure starting absolute position for each chip described above, are supplied to the illumination system CPU 20 through the main CPU 52. The illumination system CPU 20, upon receipt of the data, calculates the exposure executing absolute positions for all the areas to be exposed, and the results of the calculation are supplied to the operator 26.

After the completion of the above-described operations, the reticle stage 9 and the wafer stage 16 start the scan exposure operation for the first chip while maintaining the relative positional relations determined by the above-described operations. At this time, in the exposure apparatus, the scanning speed instruction levels written in the memory 43 and memory 46 from the stage CPU 40, by which the reticle 8 and the wafer 14 are driven in the opposite directions at the same speed ratio which is equal to the reduction magnification ratio of the projection system 13, relative to the projection system 13 (lens), while maintaining the above-described positional relationship.

At this time, the absolute position of the wafer stage 16 is always supplied to the operator 26. When the data represents the already determined exposure starting absolute position, the excimer laser 1 (pulse light source) is supplied with the light emitting instructions.

In this exposure apparatus, in parallel with the above-described operations, the above-described continuous effective movement average value control is executed using the illumination system CPU 20. The details thereof have been described in the foregoing. As to the actual operations, the light energy is measured by the photosensor 6 for each emission of the excimer laser 1.

The photosensor 6 produces light current proportional to the light energy of the excimer laser. The light current is converted to a voltage by a current-voltage converter 23, and is further integrated by an integrator 24. The data are converted by AD converter 25 into digital data, and the converted data are supplied to the illumination CPU 20. The illumination CPU 20 carries out the measurement of the light energy described in the foregoing, and thereafter, the light energy to be used for the next pulse light is calculated through the above-described continuous effective movement average value control, and the charge voltage instruction level capable of outputting the thus determined light energy is determined on the basis of the data in the RAM 22 relating to the interrelation between the charge voltage and the light energy, and the determined data is written in the memory 27.

The data is converted to analog data by DA converter 28, and is supplied to the excimer laser 1 as the charging voltage instruction level, and are used for the light energy control for the next pulse light emission. In the exposure apparatus, in parallel with the above-described continuous effective movement average value control, the real time correction for the relationship between the above-described charge voltage and the light energy is carried out.

This correction is used to selectively set the charge voltage instruction level of the excimer laser 1 upon the exposure start to the upper energy instruction level EL1 or the lower energy instruction level EL2, described hereinbefore, and also to measure the light energy for each emission of the excimer laser 1 and effect real time correction of the relation between the charge voltage and the light energy, by which the light energy required for the next pulse light is determined by controlling the charge voltage. The relation between the charge voltage and the light energy is always determined by the least squares method on the basis of a certain number of latest data. In this manner, the scanning exposure for one chip is completed, and such operations are repeated for all of the chips to be exposed on the wafer, so that the processing of one wafer is completed.

(Y7) Delivery of the wafer

Upon the completion of the exposure operation, the wafer stage 16 is moved to a wafer delivery position, and the wafer is transported by a wafer transportation system (not shown) from the wafer chuck 14 on the wafer stage 15.

Figure 15:
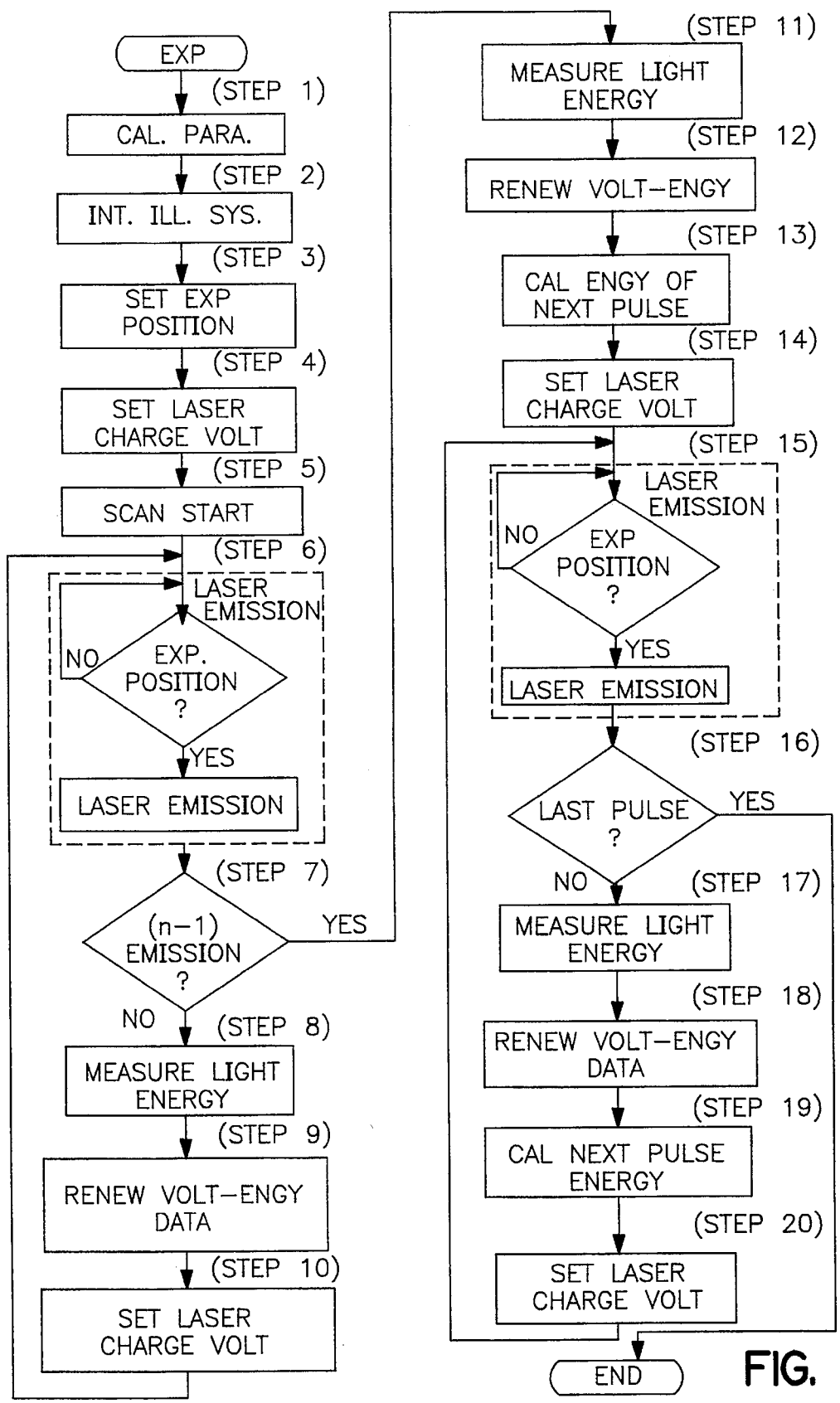
FIG. 15 is a flow chart of an exposure control for the apparatus of the first embodiment.

FIG. 15 is a flow chart for the exposure control in the first embodiment. Each step in this flow chart represents the following function block.

Step 1: Parameter calculation corresponding to the determination of various parameters (Y2). More particularly, the following parameters are calculated by the main CPU:

(1) The number of pulses Nc until the decreased area is overlaid on the increased area (2) Scanning speed Vw (3) Excimer laser upper energy instruction level EL1

(4) Excimer laser lower energy instruction level EL2

(5) Oscillation frequency of the excimer laser fe (6) Transmittance a of the attenuator Step 2: Illumination initial setting corresponding to "initial setting of the illumination system" (Y3). More particularly, the initial setting of the illumination system is carried out as follows:

(1) The scanning speed Vw data are supplied to the stage CPU 40 from the main CPU 52.

(2) The upper energy instruction level EL1 and lower energy instruction level EL2 are supplied to the illumination system CPU 20 from the main CPU 52.

(3) The excimer laser oscillation frequency fe is supplied to the illumination system CPU 20 and the stage CPU 40 from the main CPU 52. The illumination CPU 20 supplies the parameters to the excimer laser 1 through the communication path.

(4) Attenuation ratio α of the attenuator is supplied from the main CPU 52 to the illumination system CPU 20. The illumination system CPU 20 drives the attenuator to the position for providing this attenuation ratio.

Step 3: Exposure execution position setting for setting the exposure execution position in the operator. After the completion of the alignment, the data of the exposure starting absolute position for each chip and the particular wafer stage movement width for each pulse exposure, are determined by the main CPU 52. The main CPU 52 supplies the data to the illumination system CPU 20. The illumination system CPU 20, upon receipt of the data, calculates the exposure execution absolute positions for all the areas to be exposed, and the results are supplied to the operator 26.

Steps 4, 10, 14 and 20: Laser charge voltage setting. The laser charging voltage required for the required light energy is determined from the relation between the laser charging voltage and the light energy, and effect the setting for the laser.

Step 5: Scan start. The scanning exposure is started while maintaining the relative positions between the reticle stage 9 and the wafer stage 16, determined during the alignment operation.

Step 6: Laser emission. The laser is emitted. This block, as is contrasted to the other blocks, the operations are carried out by hardware. More particularly, the absolute position Of the wafer stage 16 is always supplied to the operator 26, and when the preset exposure execution absolute position is reached, the excimer laser 1 (pulse light source) is supplied with the emission instruction.

Step 7: Laser emission pulse number discrimination (initial pulse). The discrimination is made as to whether or not the pulse number for executing the continuous effective movement average value control is to be executed is reached.

Steps 8, 11 and 17: Light energy measurement. The light energy upon the laser emission executed in Steps 6 and 15, is measured. More particularly, for each emission of the excimer laser 2, the photosensor 6, the current-voltage converter 23, an integrator 24, and AD converter 25 are used to execute the measurement of the integrated data of the light energy.

Steps 9, 12 and 18: Renewal of the data of the relation between the laser charging voltage and the light energy. From the laser charging voltage set level at Step 4 and the light energy measurement at Steps 8, 11 and 17, the laser charging voltage vs light energy data stored in the RAM 22 are renewed. The initial data are stored in the ROM 21, which is supplied from the ROM 21 to the RAM 22 at the initial setting of the apparatus.

Steps 13 and 19: Next pulse energy calculation. At the number of pulses for executing the continuous effective movement average value control, the light energy for the next pulse is calculated to provide a constant average. More particularly, the next pulse energy is calculated such that the average light energy upon the following even number pulse n is always equal to EL of equation (40):

$$n=(M1\times 2)+M2.$$

Step 16: Laser emission pulse number discrimination (last pulse). The discrimination is made as to whether or not the exposure completion pulse number is reached or not.

In this embodiment, after the parameter calculation (Step 1), the illumination system initial setting (Step 2) and the exposure execution position setting (Step 3), the laser charging voltage setting (Step 4) is executed, and the scanning operation is started (Step 5). The laser charging voltage set here is obtained so as to provide the light energy EL1 in equation (44).

Thereafter, for each arrival of the wafer stage to the exposure executing position, the laser emission (Step 6) is automatically executed by hardware. At this time, the light energy measurement (Step 8) is carried out, and the laser charging voltage vs light energy data is renewed (Step 9) on the basis of the laser charging voltage set level and the measured light energy. In addition, the charging voltages for providing the light energy levels EL1 and EL2 are alternately set, and the operations are repeated until one pulse before the number of pulses for the execution of the continuous effective movement average value control.

When the laser emission to one pulse before the pulse number for executing the continuous effective movement average value control is carried out (Step 7), the light energy measurement (Step 11) and the renewal of the laser charging voltage vs light energy data (Step 12) are carried out in the previous manner. Upon reaching the number of pulses for executing the continuous effective movement average value control, the energy for providing the constant energy average value EL is provided by the predetermined number of pulses including the next pulse light, and the laser charging voltage is set to accomplish this (Step 14).

During the above operation, the scanning exposure continues. When the next exposure executing position is reached (Step 15), the continuous effective movement average value control is started using the above determined laser charging voltage.

In the continuous effective movement average value control, the above-described light energy measurement (Step 17), the renewal of the data (Step 18), the next pulse energy calculation (Step 19), the laser charging voltage setting (Step 20), are carried out, and the same operations are repeated until the last exposure pulse is reached.

As described in the foregoing, according to this embodiment, until one pulse before the number of pulses for executing the continuous effective movement average value control, the charging voltages for providing the light energy levels EL1 and EL2 are alternately set, and after the number of pulses for executing the continuous effective movement average value control is reached, the control is effected to provide the constant energy average value EL by the next pulse light.

Even after the pulse number for executing the continuous effective movement average value control is reached, the effect of the dispersion control of the laser charging voltage having been effected one pulse before the number of pulse for execution of the continuous effective movement average value control, remains due to the periodic nature of the average value control, and therefore, there is no need of any deliberate operation for the renewal of the laser charging voltage vs light energy data, during the execution of the continuous effective movement average value control.

As for another embodiments of the present invention, a description will be given.

Z1 As for other embodiments of the continuous movement average value control, there are the following 5 types.

Z1-1 The continuous movement average value control is effected at the pulse number between the pulse number for the continuous effective pulse movement average value control and the pulse number for each average calculation of the continuous partial pulse movement average value control.

Z1-2 The pulse number for the optimum average value calculation and/or the instruction level attenuation ratio in the continuous movement average value control, are determined on the basis of the result of measurement of the integrated exposure amount measuring system in the illumination system.

Z1-3 The pulse number for the optimum average value calculation and/or the instruction level attenuation ratio in the continuous movement average value control, are determined on the basis of measurements by an integrated exposure amount measuring system in the wafer stage side.

Z1-4 The continuous effective pulse movement average value control and the continuous partial pulse movement average value control are automatically switched therebetween on the basis of information relating to the wafer.

Z1-5 The continuous effective pulse movement average value control and the continuous partial pulse movement average control are automatically switched therebetween on the basis of information relating to a chip on the wafer, during the exposure operation for one chip.

Z2 As for the other embodiments of the dispersion control of the laser charging voltage instruction level, there are the following examples.

Z2-1 The number of data for determining the relationship between the charging voltage and the light energy is dynamically changed in accordance with the change of the data. For example, when the light energy level relative to a certain charging voltage changes abruptly to another level at a certain instance, and the changed state continues, only the data after the change are used as effective data. Or, for the determination of the relation between the charging voltage and the light energy, the effectiveness of the data after the change is increased. By doing so, the apparatus can meet the charging voltage vs light energy change due to gas injection in the excimer laser or the like.

Figure 1:
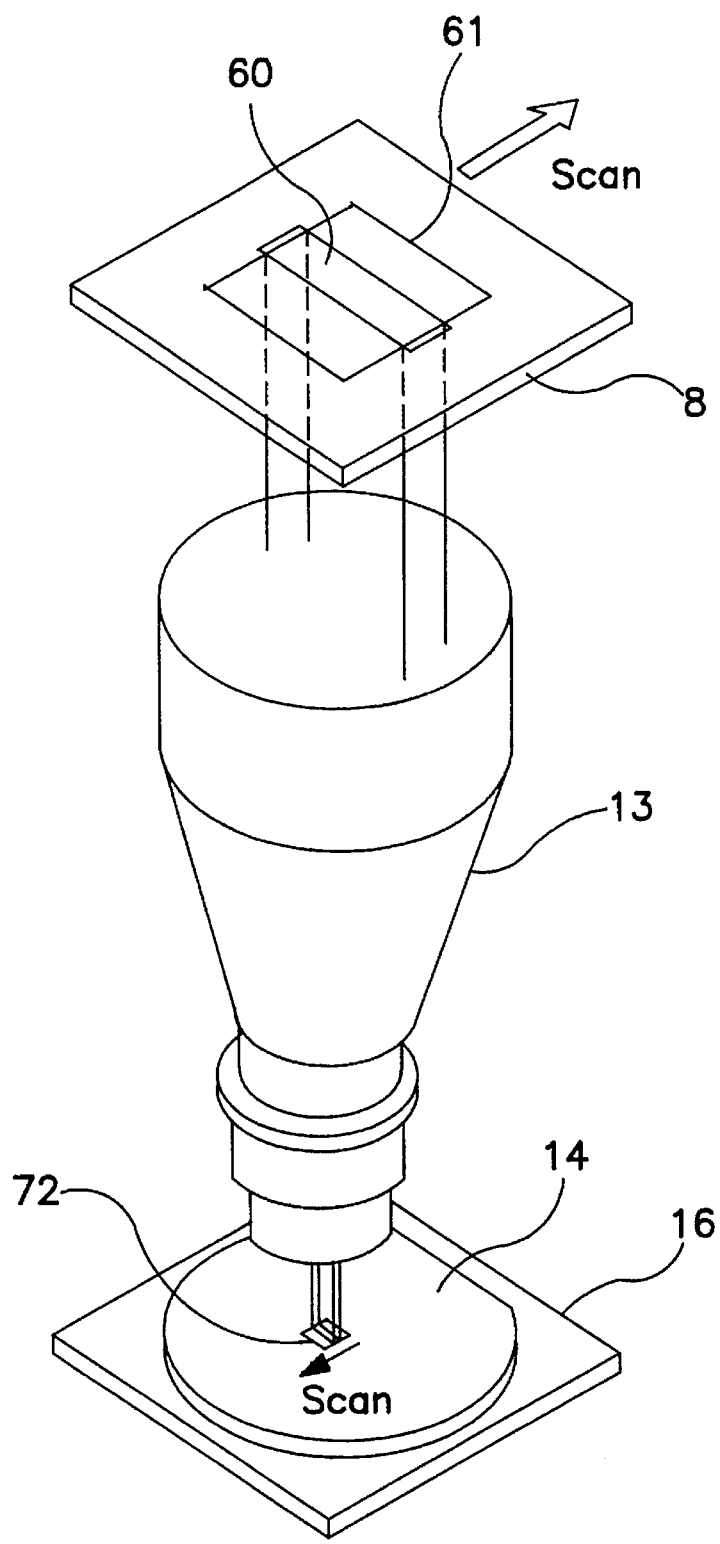
FIG. 1 illustrates a scanning type exposure apparatus.

A description will be given as to a semiconductor device manufacturing method using the exposure apparatus of FIG. 1.

Figure 16:
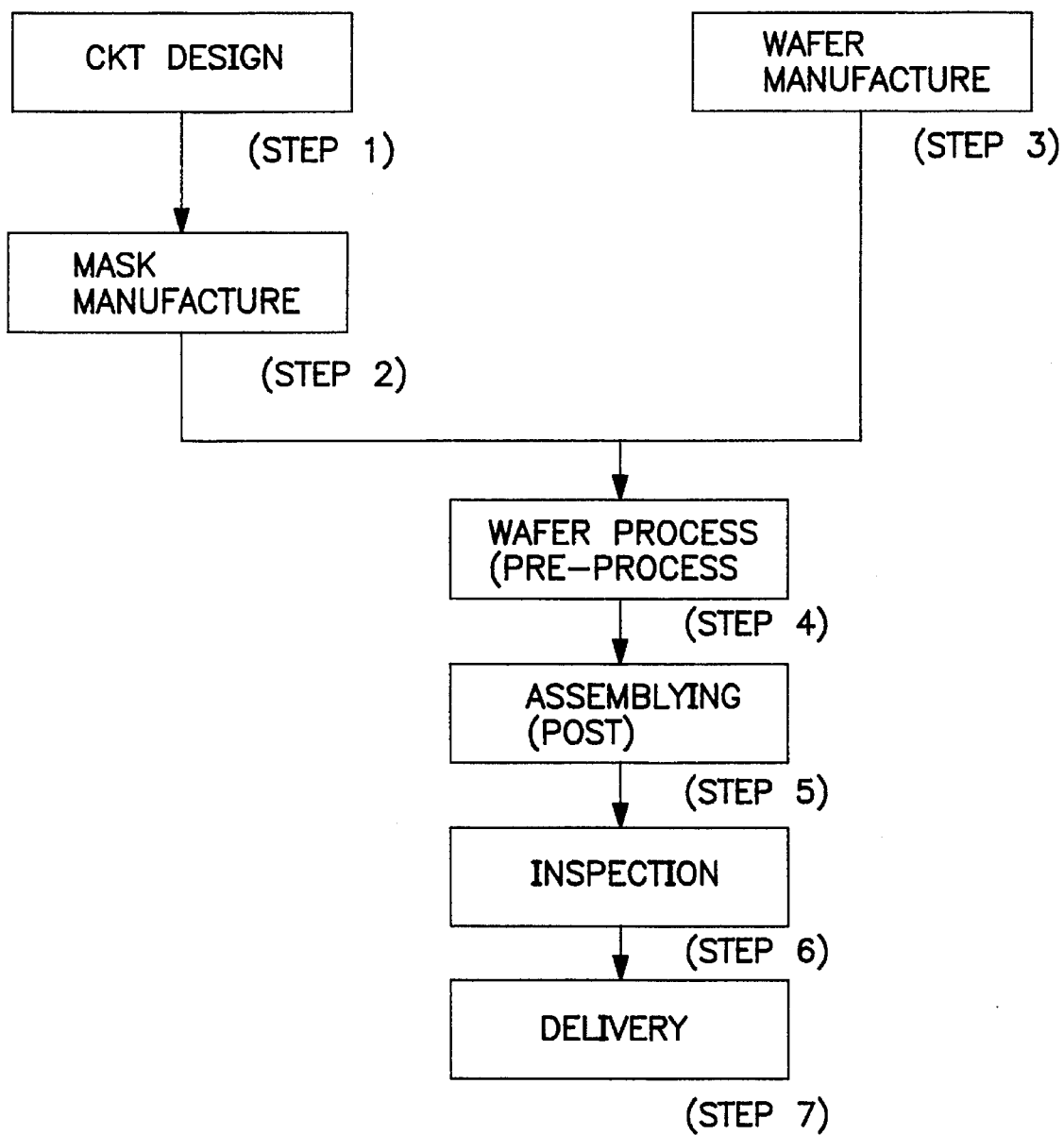
FIG. 16 is a flow chart of a manufacturing method for manufacturing a semiconductor device according to an embodiment of the present invention.

FIG. 16 is a flow chart of manufacturing semiconductor devices such as IC, LSI or the like, or devices such as liquid crystal panel or CCD or the like. At step 1, (circuit design), the circuits of the semiconductor device are designed. At step (mask manufacturing) 2, the mask (reticle 304) having the designed circuit pattern is manufactured. On the other hand, at step 3, a wafer (306) is manufactured using the proper material such as silicon. Step 4 (wafer processing) the pre-step, in which an actual circuit pattern is formed on a wafer through lithographic techniques using the prepared mask and wafer. At step 5 (post-step), a semiconductor chip is manufactured from the wafer subjected to the operations of step 4. The step 5 includes assembling steps (dicing, bonding), packaging step (chip sealing) or the like. At step 6 (inspection), the operation of the semiconductor device manufactured by the step 5 is inspected, and a durability test thereof is carried out. In this manner, the semiconductor device is manufactured and delivered at step 7.

Figure 17:
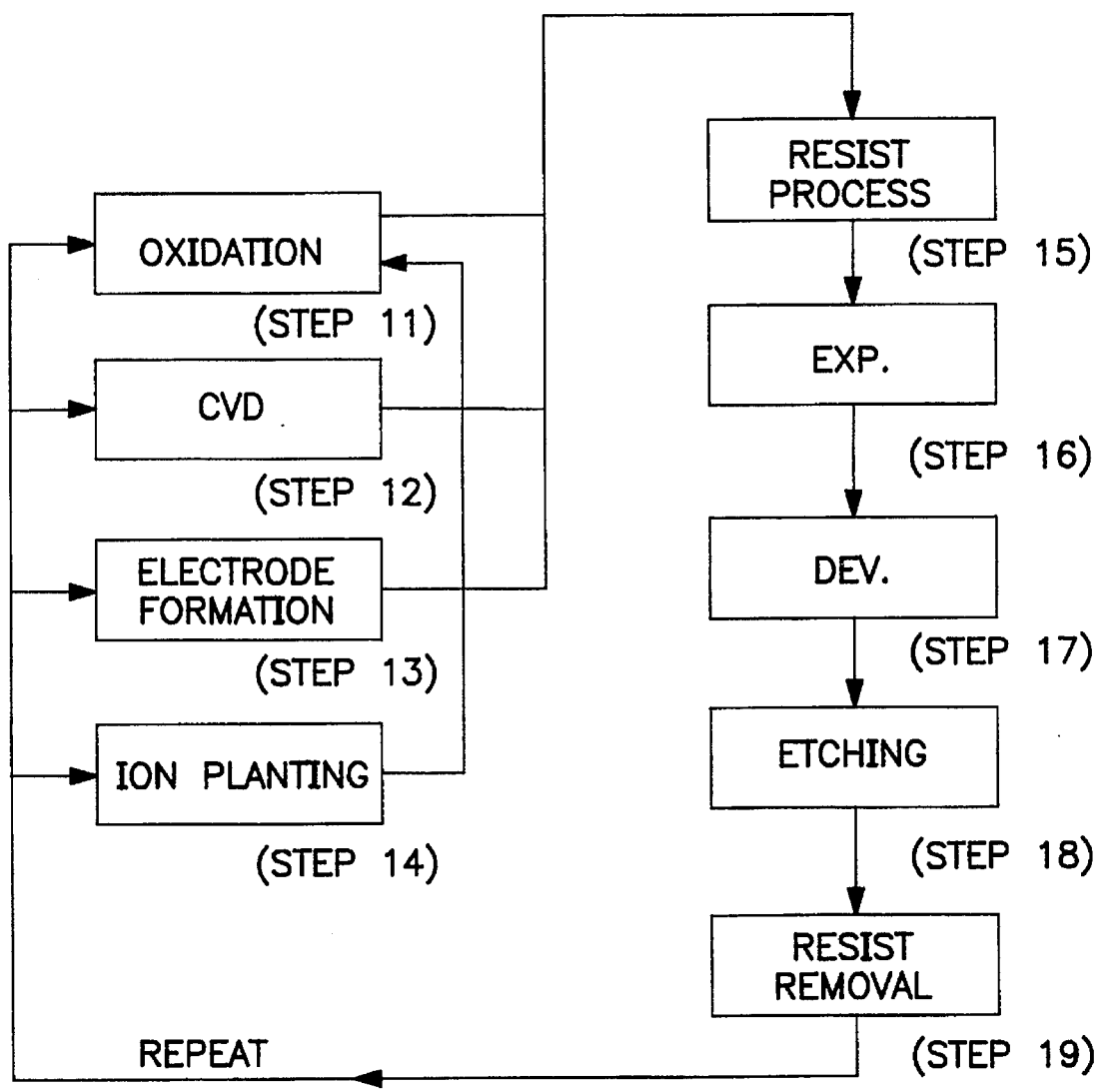
FIG. 17 is a flow chart of a manufacturing method for manufacturing a semiconductor device according to an embodiment of the present invention.

FIG. 17 is a flow chart of detailed wafer processing. At step 11 (oxidation), the surface of the wafer is oxidized. At step 12 (CVD), an insulating film is formed on a surface of the wafer. At step 13 (electrode formation), an electrode is formed on the wafer by evaporation. At step 14 (ion injection), ions are implemented into the wafer. At step 15 (resist processing), a photosensitive material is applied on the wafer. At step 16 (exposure), the circuit pattern of the mask (reticle 304) is projected onto the wafer by the above-described exposure apparatus. At step 17 (development), the exposed wafer is developed. At step 18 (etching), the portions outside the resist image are removed. At step 19 (resist removal), the resist is removed after the etching. By repeating the above-described steps, overlaid circuit patterns are formed on the wafer.

According to the manufacturing method of this embodiment, a high integrating density semiconductor device or the like can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A scanning type exposure apparatus comprising:

scanning means for scanningly moving a mask and a substrate relative to a plurality of light pulses;

irradiating means for continuously irradiating the substrate with the light pulses transmitted through the mask; and control means for controlling an exposure amount of the substrate, wherein said control means controls an average value of light quantity of a predetermined number of continuous light pulses to be substantially equal to a predetermined target value by controlling the light quantity of a next light pulse in accordance with an integrated light quantity of a previous number of light pulses.

2. An apparatus according to claim 1, wherein each light pulse from the irradiating means includes a substantially rectangular light intensity distribution in a direction of a scanning movement.

3. An apparatus according to claim 1, wherein each light pulse from said irradiating means includes a substantially trapezoidal light intensity distribution in a direction of a scanning movement.

4. An apparatus according to claim 3, wherein the trapezoidal shape is substantially symmetrical with respect to a straight line.

5. An apparatus according to claim 1, wherein said irradiating means includes an excimer laser for emitting the light pulses.

6. An apparatus according to claim 1, wherein said control means performs a resetting operation to reset a relationship between an instruction level and a light quantity of the basis of each light quantity for a plurality of light pulses and the instruction level used for supplying the plurality of light pulses.

7. An apparatus according to claim 6, wherein the resetting operation is carried out during an exposure operation.

8. An apparatus according to claim 6, wherein the resetting operation is executed before a start of an exposure operation.

9. A scanning type exposure apparatus comprising:

scanning means for scanningly moving a mask and a substrate relative to a plurality of light pulses;

irradiating means for continuously irradiating the substrate with the light pulses transmitted through the mask; and control means for controlling an exposure amount of the substrate, wherein said control means controls an average value of light quantity of a predetermined number of continuous light pulses to be substantially equal to a predetermined target value by controlling the light quantity of a next light pulse in accordance with an integrated light quantity of a previous number of light pulses, wherein the predetermined number of pulses is equal to a number of light pulses projected to each portion of the substrate while each portion of the substrate passes through an illumination area of the light pulses.

10. A scanning type exposure apparatus comprising:

scanning means for scanningly moving a mask and a substrate relative to a plurality of light pulses;

irradiating means for continuously irradiating the substrate with the light pulses transmitted through the mask; and control means for controlling an exposure amount of the substrate, wherein said control means controls an average value of light quantity of a predetermined number of continuous light pulses to be substantially equal to a predetermined target value by controlling the light quantity of a next light pulse in accordance with an integrated light quantity of a previous number of light pulses, wherein each light pulse from said irradiating means includes a substantially trapezoidal light intensity distribution in a direction of a scanning movement, and wherein the predetermined number of pulses is equal to a number of light pulses projected to each portion of the substrate while each portion of the substrate passes through the longer side of the trapezoidal shape of an illumination area of the light pulse.

11. A scanning type exposure method comprising the steps of:

scanningly moving a mask and a substrate relative to a plurality of light pulses;

continuously irradiating, with irradiating means, the substrate with the light pulses transmitted through the mask; and controlling, with control means, an exposure amount of the substrate, wherein said control means controls an average value of light quantity of a predetermined number of continuous light pulses to be substantially equal to a predetermined target value by controlling the light quantity of a next light pulse in accordance with an integrated light quantity of a previous number of light pulses.

12. A method according to claim 11, wherein each light pulse from the irradiating means includes a substantially rectangular light intensity distribution in a direction of a scanning movement.

13. A method according to claim 11, wherein each light pulse from said irradiating means includes a substantially trapezoidal light intensity distribution in a direction of a scanning movement.

14. A method according to claim 13, wherein the trapezoidal shape is substantially symmetrical with respect to a straight line.

15. A method according to claim 11, wherein said irradiating means includes an excimer laser for emitting the light pulses.

16. A method according to claim 11, wherein said control means performs a resetting operation to reset a relationship between an instruction level and a light quantity on the basis of each light quantity for a plurality of light pulses and the instruction level used for supplying the plurality of light pulses.

17. A method according to claim 16, wherein the resetting operation is carried out during an exposure operation.

18. A method according to claim 16, wherein the resetting operation is executed before a start of an exposure operation.

19. A device manufacturing method through an exposure method defined in any one of claims 15 and 16–18.

20. A scanning type exposure method comprising the steps of:

scanningly moving a mask and a substrate relative to a plurality of light pulses;

continuously irradiating, with irradiating means, the substrate with the light pulses transmitted through the mask; and controlling, with control means, an exposure amount of the substrate, wherein said control means controls an average value of light quantity of a predetermined number of continuous light pulses to be substantially equal to a predetermined target value by controlling the light quantity of a next light pulse in accordance with an integrated light quantity of a previous number of light pulses, wherein the predetermined number of pulses is equal to a number of light pulses projected to each portion of the substrate while each portion of the substrate passes through an illumination area of the light pulses.

21. A scanning type exposure method comprising the steps of:

scanningly moving a mask and a substrate relative to a plurality of light pulses;

continuously irradiating, with irradiating means, the substrate with the light pulses transmitted through the mask; and controlling, with control means, an exposure amount of the substrate, wherein said control means controls an average value of light quantity of a predetermined number of continuous light pulses to be substantially equal to a predetermined target value by controlling the light quantity of a next light pulse in accordance with an integrated light quantity of a previous number of light pulses, wherein each light pulse from said irradiating means includes a substantially trapezoidal light intensity distribution in a direction of a scanning movement, and wherein the predetermined number of pulses is equal to a number of light pulses projected to each portion of the substrate while each portion of the substrate passes through the longer side of the trapezoidal shape of an illumination area of the light pulse.

22. A device manufacturing method through a method defined in any one of claims 20 or 21.

* * * * *

UNITED STATES PATENT AND TRADEMARK OFFICE
CERTIFICATE OF CORRECTION

PATENT NO. : 5,608,492
DATED : March 4, 1997
INVENTOR(S) : MITSUYA SATO

It is certified that error appears in the above-identified patent and that said Letters Patent is hereby corrected as shown below:

COLUMN 4

Line 28, "Converter" should read --converter--.
Line 39, "The" should read --the--.

COLUMN 5

Line 63, "is" should be deleted.

COLUMN 7

Line 19, "The" should read --the--.

COLUMN 8

Line 53, "Illustrates" should read --illustrates--.
Line 65, "When" should read --when--.

COLUMN 9

Line 11, "o/N..." should read --$\sigma$/N...--.

UNITED STATES PATENT AND TRADEMARK OFFICE
CERTIFICATE OF CORRECTION

PATENT NO. : 5,608,492

DATED : March 4, 1997

INVENTOR(S) : MITSUYA SATO

It is certified that error appears in the above-indentified patent and that said Letters Patent is hereby corrected as shown below:

COLUMN 10

Line 23, "If" should read --if--.

COLUMN 11

Line 53, "ell" should read --e11--.

COLUMN 12

Line 7, "The" should read --the--.
    Line 18, "1," should read --1,--.
    Line 20, "1," should read --1,--.
    Line 56, "prevention," should read --prevention, is--.

COLUMN 13

Line 17, "Control" should read --control--.

COLUMN 14

Line 29, "a" should read --$\alpha$--.
    Line 53, "a" should read --$\alpha$--.

UNITED STATES PATENT AND TRADEMARK OFFICE
CERTIFICATE OF CORRECTION

PATENT NO. : 5,608,492
DATED : March 4, 1997
INVENTOR(S) : MITSUYA SATO

It is certified that error appears in the above-identified patent and that said Letters Patent is hereby corrected as shown below:

COLUMN 17

Line 39, "a" should read --$\alpha$--.

COLUMN 18

Line 10, "a" should read --$\alpha$--.
Line 11, "a" should read --$\alpha$--.
Line 12, " attenuator 1, " should read --alternator is 1,--.

COLUMN 19

Line 44, "levels" should read --levels are--.

COLUMN 20

Line 49, "a" should read --$\alpha$--.

UNITED STATES PATENT AND TRADEMARK OFFICE
CERTIFICATE OF CORRECTION

PATENT NO. : 5,608,492

DATED : March 4, 1997

INVENTOR(S) : MITSUYA SATO

It is certified that error appears in the above-identified patent and that said Letters Patent is hereby corrected as shown below:

COLUMN 21

Line 21, "Of" should read --of--.

COLUMN 22

Line 50, "another" should read --other--.

COLUMN 26

Line 6, "claims 15 and 16-18." should read --claims 11-18.--.

Signed and Sealed this

Eleventh Day of November, 1997

Attest:

BRUCE LEHMAN

Attesting Officer

Commissioner of Patents and Trademarks